US010911152B2

(12) United States Patent
Hassan et al.

(10) Patent No.: US 10,911,152 B2
(45) Date of Patent: *Feb. 2, 2021

(54) POWER-BASED DECODING OF DATA RECEIVED OVER AN OPTICAL COMMUNICATION PATH

(71) Applicant: Microsoft Technology Licensing, LLC, Redmond, WA (US)

(72) Inventors: Amer Aref Hassan, Kirkland, WA (US); Wei-Chen Chen, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/388,393

(22) Filed: Apr. 18, 2019

(65) Prior Publication Data

US 2020/0336214 A1 Oct. 22, 2020

(51) Int. Cl.
*H04B 10/60* (2013.01)
*H04B 10/25* (2013.01)
(Continued)

(52) U.S. Cl.
CPC ............ *H04B 10/60* (2013.01); *H04B 10/25* (2013.01); *H04B 10/70* (2013.01);
(Continued)

(58) Field of Classification Search
CPC ........ H04B 10/60; H04B 10/25; H04B 10/70; H04B 10/516; H04B 10/564;
(Continued)

(56) References Cited

U.S. PATENT DOCUMENTS 3,984,190 A 10/1976 Barrett et al.
4,150,284 A 4/1979 Trenkler et al.
(Continued)

FOREIGN PATENT DOCUMENTS

EP 0234730 B1 7/1992
EP 0975104 A1 1/2000
(Continued)

OTHER PUBLICATIONS

"Notice of Allowance Issued in U.S. Appl. No. 16/387,784", dated Mar. 11, 2020, 11 Pages.
(Continued)

*Primary Examiner* — Dibson J Sanchez
(74) *Attorney, Agent, or Firm* — Schwegman Lundberg & Woessner, P.A.

(57) ABSTRACT

A system for transmitting data over an optical communication path is configured to receive data to be encoded in a bitstream for transmission using an optical communication path and encodes the received data to obtain a bitstream. The system is further configured to determine that the bitstream includes a sequence of consecutive bits, and obtain a power level at which to transmit a portion of the bitstream based on a count of the consecutive bits in the sequence. The system may be configured to selectively activate a light source at a power level according to a modulation scheme to optically transmit the portion of the bitstream at the power level.

20 Claims, 12 Drawing Sheets

(51) Int. Cl.
- *H04B 10/70* (2013.01)
- *H04L 27/38* (2006.01)
- *H04B 10/54* (2013.01)
- *H04B 10/079* (2013.01)
- *H04J 14/08* (2006.01)
- *H04B 10/564* (2013.01)
- *H04B 10/516* (2013.01)
- *H04L 1/00* (2006.01)

(52) U.S. Cl.
 CPC ...... *H04B 10/07955* (2013.01); *H04B 10/516* (2013.01); *H04B 10/541* (2013.01); *H04B 10/564* (2013.01); *H04J 14/08* (2013.01); *H04L 1/0057* (2013.01); *H04L 27/38* (2013.01)

(58) Field of Classification Search
 CPC ............ H04B 10/07955; H04B 10/541; H04L 1/0057; H04L 27/38; H04J 14/08
 USPC ................ 398/9–38, 43–103, 202–214
 See application file for complete search history.

(56) References Cited

U.S. PATENT DOCUMENTS

| | | | |
|---|---|---|---|
| 4,476,495 A | | 10/1984 | Fujisawa et al. |
| 4,763,326 A | * | 8/1988 | Krick .............. H04J 7/00 370/527 |
| 4,829,596 A | | 5/1989 | Barina |
| 5,410,147 A | | 4/1995 | Riza et al. |
| 5,510,919 A | * | 4/1996 | Wedding .......... H04B 10/50 375/287 |
| 5,737,366 A | | 4/1998 | Gehlot |
| 5,793,880 A | | 8/1998 | Constant |
| 6,148,428 A | | 11/2000 | Welch et al. |
| 6,366,381 B1 | | 4/2002 | Anderson |
| 6,424,444 B1 | | 7/2002 | Kahn et al. |
| 6,433,904 B1 | | 8/2002 | Swanson et al. |
| 6,437,893 B1 | | 8/2002 | Rivollet et al. |
| 6,490,067 B2 | | 12/2002 | Bloom et al. |
| 6,580,535 B1 | | 6/2003 | Schonfelder |
| 6,609,139 B1 | | 8/2003 | Dultz et al. |
| 6,748,083 B2 | | 6/2004 | Hughes et al. |
| 6,816,726 B2 | | 11/2004 | Lysejko et al. |
| 6,851,086 B2 | | 2/2005 | Szymanski |
| 6,868,236 B2 | | 3/2005 | Wiltsey et al. |
| 6,915,076 B1 | | 7/2005 | Mittal et al. |
| 6,963,175 B2 | | 11/2005 | Archenhold et al. |
| 7,032,238 B2 | | 4/2006 | Parnell et al. |
| 7,050,723 B2 | | 5/2006 | Katagiri et al. |
| 7,110,681 B1 | * | 9/2006 | Mizuochi .......... H04B 10/505 341/53 |
| 7,113,708 B1 | | 9/2006 | Creaney et al. |
| 7,139,491 B2 | | 11/2006 | Katagiri et al. |
| 7,177,320 B2 | | 2/2007 | Lysejko et al. |
| 7,212,742 B2 | | 5/2007 | Peddanarappagari et al. |
| 7,286,762 B2 | | 10/2007 | Elahmadi et al. |
| 7,305,091 B1 | | 12/2007 | Hirano |
| 7,307,569 B2 | | 12/2007 | Vrazel et al. |
| 7,477,849 B2 | * | 1/2009 | Ahmed .............. H04L 25/4908 398/162 |
| 7,489,875 B2 | | 2/2009 | Murphy |
| 7,606,272 B2 | | 10/2009 | Beausoleil et al. |
| 7,689,130 B2 | | 3/2010 | Ashdown |
| 7,830,575 B2 | | 11/2010 | Moon et al. |
| 7,844,186 B2 | | 11/2010 | Dorrer et al. |
| 7,936,829 B2 | | 5/2011 | Romero et al. |
| 7,970,349 B2 | | 6/2011 | Chen et al. |
| 7,983,570 B2 | | 7/2011 | Han et al. |
| 7,986,783 B2 | * | 7/2011 | Ikushima .......... H04L 25/4917 375/286 |
| 8,155,175 B2 | | 4/2012 | Olgaard |
| 8,213,801 B2 | | 7/2012 | Nien et al. |
| 8,295,485 B2 | | 10/2012 | Yuan et al. |
| 8,552,659 B2 | | 10/2013 | Ashdown et al. |
| 8,559,378 B2 | | 10/2013 | Schaepperle |
| 8,873,965 B2 | | 10/2014 | Giustiniano et al. |
| 8,879,925 B2 | | 11/2014 | Akiyama et al. |
| 8,929,402 B1 | | 1/2015 | Hughes |
| 8,948,600 B2 | | 2/2015 | Kwon et al. |
| 9,014,551 B1 | | 4/2015 | Stooke |
| 9,094,151 B2 | | 7/2015 | Prez De Aranda Alonso Rúben et al. |
| 9,386,587 B2 | | 7/2016 | Hu et al. |
| 9,401,766 B2 | | 7/2016 | Yuan et al. |
| 9,608,733 B2 | | 3/2017 | Pavlas et al. |
| 9,787,404 B2 | | 10/2017 | Cesnik |
| 9,800,399 B2 | | 10/2017 | Tanzilli et al. |
| 9,813,127 B2 | | 11/2017 | George et al. |
| 9,826,540 B1 | | 11/2017 | Li et al. |
| 9,859,977 B2 | | 1/2018 | Zhao et al. |
| 9,946,723 B2 | | 4/2018 | Lawrence |
| 10,117,120 B2 | | 10/2018 | Sun et al. |
| 10,135,540 B2 | | 11/2018 | Medra et al. |
| 10,182,480 B2 | | 1/2019 | Scapa et al. |
| 10,187,171 B2 | | 1/2019 | Doster et al. |
| 10,193,722 B2 | | 1/2019 | Guha |
| 10,219,695 B2 | | 3/2019 | Bhadri et al. |
| 10,230,468 B2 | | 3/2019 | Mansouri Rad et al. |
| 10,231,687 B2 | | 3/2019 | Kahn et al. |
| 10,333,622 B2 | | 6/2019 | Bhoja et al. |
| 10,404,379 B2 | | 9/2019 | Shiraishi |
| 10,476,728 B2 | | 11/2019 | Zhang et al. |
| 10,686,530 B1 | | 6/2020 | Hassan |
| 10,742,325 B1 | * | 8/2020 | Hassan ............... H04L 1/0057 |
| 10,742,326 B1 | * | 8/2020 | Hassan ............... H04B 10/50 |
| 2001/0033406 A1 | | 10/2001 | Koike et al. |
| 2002/0171899 A1 | * | 11/2002 | Gurusami .......... H04B 10/6931 398/141 |
| 2002/0196510 A1 | * | 12/2002 | Hietala .............. H04L 27/367 398/202 |
| 2003/0030873 A1 | | 2/2003 | Hietala et al. |
| 2003/0032391 A1 | | 2/2003 | Schweinhart et al. |
| 2003/0072050 A1 | | 4/2003 | Vrazel et al. |
| 2003/0076569 A1 | | 4/2003 | Stevens |
| 2003/0223762 A1 | | 12/2003 | Ho et al. |
| 2003/0231676 A1 | | 12/2003 | Buckman et al. |
| 2003/0235415 A1 | | 12/2003 | Peters et al. |
| 2004/0013429 A1 | | 1/2004 | Duelk et al. |
| 2004/0028412 A1 | | 2/2004 | Murphy |
| 2004/0057733 A1 | | 3/2004 | Azadet et al. |
| 2005/0012033 A1 | | 1/2005 | Stern et al. |
| 2005/0100336 A1 | | 5/2005 | Mendenhall et al. |
| 2005/0213966 A1 | | 9/2005 | Chown et al. |
| 2006/0088110 A1 | | 4/2006 | Romero et al. |
| 2006/0115272 A1 | * | 6/2006 | Minato ............... H04J 14/005 398/77 |
| 2006/0127102 A1 | | 6/2006 | Roberts et al. |
| 2006/0165190 A1 | | 7/2006 | Tamaki et al. |
| 2006/0204247 A1 | | 9/2006 | Murphy |
| 2007/0014286 A1 | | 1/2007 | Lai |
| 2007/0041731 A1 | * | 2/2007 | Yasumoto .......... H04B 10/032 398/140 |
| 2007/0092265 A1 | | 4/2007 | Vrazel et al. |
| 2007/0160212 A1 | | 7/2007 | Zavriyev et al. |
| 2007/0165862 A1 | | 7/2007 | Young et al. |
| 2007/0201692 A1 | * | 8/2007 | Furusawa .......... H04B 10/505 380/45 |
| 2007/0201867 A1 | * | 8/2007 | DeLew .............. H04B 10/077 398/38 |
| 2007/0222654 A1 | | 9/2007 | Vrazel et al. |
| 2007/0280684 A1 | * | 12/2007 | Onoda ............... H04B 10/03 398/38 |
| 2008/0019523 A1 | | 1/2008 | Fuse et al. |
| 2008/0129564 A1 | | 6/2008 | Kitayama et al. |
| 2008/0138087 A1 | | 6/2008 | Snyder |
| 2008/0166131 A1 | | 7/2008 | Hudgins et al. |
| 2008/0166135 A1 | * | 7/2008 | Ann ................... H04B 10/116 398/197 |
| 2008/0224635 A1 | | 9/2008 | Hayes |
| 2008/0240734 A1 | | 10/2008 | Fuse |

(56) References Cited

U.S. PATENT DOCUMENTS

| | | | |
|---|---|---|---|
| 2008/0272276 A1* | 11/2008 | Huang | H05B 45/50 250/205 |
| 2009/0148058 A1 | 6/2009 | Dane et al. | |
| 2009/0245809 A1* | 10/2009 | Nakamoto | H04B 10/2507 398/159 |
| 2009/0269055 A1 | 10/2009 | Butler et al. | |
| 2010/0054754 A1 | 3/2010 | Miller et al. | |
| 2010/0142965 A1 | 6/2010 | Walewski et al. | |
| 2010/0182294 A1 | 7/2010 | Roshan et al. | |
| 2010/0221011 A1* | 9/2010 | Pinceman | H04J 14/0226 398/79 |
| 2011/0052195 A1 | 3/2011 | Karstens | |
| 2011/0076026 A1* | 3/2011 | Ledentsov | H04B 10/66 398/140 |
| 2011/0234436 A1 | 9/2011 | Bogoni et al. | |
| 2011/0255866 A1 | 10/2011 | Van Veen et al. | |
| 2011/0280576 A1 | 11/2011 | Chan et al. | |
| 2012/0057506 A1 | 3/2012 | Kumar | |
| 2012/0063596 A1 | 3/2012 | Brodsky et al. | |
| 2012/0063774 A1* | 3/2012 | Niibe | H04Q 11/0067 398/34 |
| 2012/0128367 A1* | 5/2012 | Yamada | H04B 10/1149 398/118 |
| 2013/0004172 A1* | 1/2013 | Sugawa | H04J 14/025 398/72 |
| 2013/0188956 A1* | 7/2013 | Abe | H04B 10/50 398/79 |
| 2013/0216219 A1 | 8/2013 | Honda et al. | |
| 2013/0236171 A1 | 9/2013 | Saunders | |
| 2013/0236194 A1 | 9/2013 | Saunders et al. | |
| 2013/0287403 A1 | 10/2013 | Roberts | |
| 2014/0199075 A1 | 7/2014 | Huh et al. | |
| 2014/0312777 A1 | 10/2014 | Shearer et al. | |
| 2014/0313387 A1 | 10/2014 | Vogelsang et al. | |
| 2014/0321859 A1* | 10/2014 | Guo | H04B 10/116 398/118 |
| 2014/0321863 A1* | 10/2014 | Diab | H04B 10/272 398/185 |
| 2015/0063476 A1 | 3/2015 | Wang et al. | |
| 2015/0071651 A1 | 3/2015 | Asmanis et al. | |
| 2015/0071653 A1* | 3/2015 | Robinson | H04B 10/2507 398/161 |
| 2015/0098705 A1 | 4/2015 | Motley | |
| 2015/0147069 A1* | 5/2015 | Brandt-Pearce | H04L 1/0668 398/186 |
| 2015/0222359 A1* | 8/2015 | Kai | H04B 10/541 398/115 |
| 2015/0222366 A1* | 8/2015 | Asmanis | H04B 10/588 398/186 |
| 2015/0318928 A1* | 11/2015 | Yoo | H04J 14/08 398/25 |
| 2015/0365172 A1* | 12/2015 | Luo | H04B 10/572 398/137 |
| 2016/0036525 A1 | 2/2016 | Pirkl | |
| 2016/0080087 A1 | 3/2016 | Koike-akino et al. | |
| 2016/0119096 A1 | 4/2016 | Sun et al. | |
| 2016/0266054 A1 | 9/2016 | Cao et al. | |
| 2017/0063466 A1 | 3/2017 | Wang et al. | |
| 2017/0099139 A1 | 4/2017 | Han et al. | |
| 2017/0168472 A1 | 6/2017 | Ando et al. | |
| 2017/0207854 A1 | 7/2017 | Blumkin et al. | |
| 2017/0250780 A1 | 8/2017 | Ge et al. | |
| 2017/0302383 A1 | 10/2017 | Medra et al. | |
| 2017/0325179 A1 | 11/2017 | Ameixieira | |
| 2017/0366368 A1 | 12/2017 | Crayford et al. | |
| 2018/0076836 A1 | 3/2018 | Zhu et al. | |
| 2018/0145753 A1 | 5/2018 | Ashrafi et al. | |
| 2018/0199378 A1 | 7/2018 | Son et al. | |
| 2018/0205465 A1 | 7/2018 | Tanaka et al. | |
| 2018/0205503 A1 | 7/2018 | Chen et al. | |
| 2018/0213305 A1 | 7/2018 | Campos et al. | |
| 2018/0227162 A1* | 8/2018 | Tokuhiro | H04B 10/695 |
| 2018/0227651 A1 | 8/2018 | Brodsky et al. | |
| 2018/0262291 A1 | 9/2018 | Doster et al. | |
| 2018/0279270 A1 | 9/2018 | Sano et al. | |
| 2018/0332373 A1* | 11/2018 | Wey | H04Q 11/0062 |
| 2018/0337816 A1 | 11/2018 | Herath et al. | |
| 2019/0017824 A1 | 1/2019 | Qiu et al. | |
| 2019/0081702 A1* | 3/2019 | Laycock | H04B 10/11 |
| 2019/0110084 A1* | 4/2019 | Jia | H04N 19/126 |
| 2019/0140741 A1 | 5/2019 | Cheng et al. | |
| 2019/0149236 A1 | 5/2019 | Wang et al. | |
| 2019/0191383 A1 | 6/2019 | Dang et al. | |
| 2019/0214852 A1 | 7/2019 | Park | |
| 2019/0239753 A1 | 8/2019 | Wentz | |
| 2019/0245646 A1 | 8/2019 | Robert Safavi et al. | |
| 2019/0280809 A1* | 9/2019 | Cho | H04L 1/0071 |
| 2019/0312694 A1 | 10/2019 | Jia et al. | |
| 2019/0317286 A1 | 10/2019 | Seyedi et al. | |
| 2019/0317315 A1 | 10/2019 | Wang et al. | |
| 2019/0376820 A1 | 12/2019 | Jones et al. | |
| 2020/0092009 A1* | 3/2020 | Bocherer | H04L 1/0041 |
| 2020/0106529 A1* | 4/2020 | Nakamura | H04B 10/50 |

FOREIGN PATENT DOCUMENTS

| | | |
|---|---|---|
| EP | 1508989 A2 | 2/2005 |
| EP | 2903187 A1 | 8/2015 |
| EP | 3244554 A1 | 11/2017 |
| RU | 2009104211 A | 8/2010 |
| WO | 0077962 A1 | 12/2000 |
| WO | 02082694 A1 | 10/2002 |
| WO | 2007083157 A1 | 7/2007 |
| WO | 2013097088 A1 | 7/2013 |

OTHER PUBLICATIONS

"Non Final Office Action Issued in U.S. Appl. No. 16/387,835", dated Feb. 5, 2020, 7 Pages.

"Notice of Allowance Issued in U.S. Appl. No. 16/388,373", dated Feb. 27, 2020, 11 Pages.

"Non-Final Office Action Issued in U.S. Appl. No. 16/387,756", dated Nov. 18, 2019, 8 Pages.

"Notice of Allowance Issued in U.S. Appl. No. 16/387,774", dated Sep. 30, 2019, 8 Pages.

"Notice of Allowance Issued in U.S. Appl. No. 16/388,178", dated Oct. 1, 2019, 12 Pages.

"Non-Final Office Action Issued in U.S. Appl. No. 16/388,211", dated Oct. 3, 2019, 18 Pages.

"Notice of Allowance Issued in U.S. Appl. No. 16/388,258", dated Nov. 19, 2019, 10 Pages.

"Non-Final Office Action Issued in U.S. Appl. No. 16/388,373", dated Nov. 15, 2019, 9 Pages.

"LDM / Layered Division Multiplexing / Power Division Multiplexing", Retrieved from https://web.archive.org/web/20170220135434/http:/www.rfwireless-world.com/ Terminology/LDM-vs-TDM-vs-FDM.html, (Feb. 20, 2017), 5 Pages.

"Poisson Regression", [online]. Retrieved from the Internet: <URL: https://docs.microsoft.com/en-us/azure/machine-learning/studio-module-reference/poisson-regression>, (Jan. 27, 2018), 7 Pages.

"T1.2 / Project xxxx/ Rev 0.5", Information Technology: Fibre Channel—Methodologies for Signal Quality Specification—3 FC-MSQS-3, (Jan. 26, 2017), 22 Pages.

Donovan, James, "How Multiplexing Techniques Enable Higher Speeds on Fiber Optic Cabling", [online]. Retrieved from the Internet: URL: https://www.commscope.com/Blog/How-Multiplexing-Techniques-Enable-Higher-Speeds-on-Fiber-Optic-Cabling/>, (Jul. 25, 2016), 7 Pages.

Feng, Zhenhua, et al., "Digital Domain Power Division Multiplexing DDO-OFDM Transmission with Successive Interference Cancellation", In Conference on Lasers and Electro-Optics, (Jun. 5, 2016), 2 Pages.

Quimby, Richard S., "Photonics and Lasers: An Introduction", John Wiley & Sons, Inc., (Apr. 14, 2006), 533 Pages.

Quimby, Richard S., Section 24-3. Power Budget in Fiber Optic Link—Receiver Sensitivity, *Photonics and Lasers—An Introduction*, John Wiley & Sons, Inc., Hoboken, New Jersey, (2006), 464-469.

(56) References Cited

OTHER PUBLICATIONS

Van Der Bij, Erik, "Fibre Channel Overview", [online]. Retrieved from the Internet: <URL: http://hsi.web.cern.ch/HSI/fcs/spec/overview.htm>, (Aug. 15, 1994), 10 Pages.
Wu, Qiong, et al., "Digital Domain Power Division Multiplexed Dual Polarization Coherent Optical OFDM Transmission", In Journal of Computing Research Repository, (Jul. 2017), 9 Pages.
U.S. Appl. No. 16/387,756, filed Apr. 18, 2019, Throughput Increases for Optical Communications.
U.S. Appl. No. 16/387,774, filed Apr. 18, 2019, Power Switching for Systems Implementing Throughput Improvements for Optical Communications.
U.S. Appl. No. 16/387,784, filed Apr. 18, 2019, Receiver Training for Throughput Increases in Optical Communications.
U.S. Appl. No. 16/388,178, filed Apr. 18, 2019, Power-Based Encoding of Data to Be Transmitted Over an Optical Communication Path.
U.S. Appl. No. 16/388,211, filed Apr. 18, 2019, Power-Based Decoding of Data Received Over an Optical Communication Path.
U.S. Appl. No. 16/388,340, filed Apr. 18, 2019, Power-Based Decoding of Data Received Over an Optical Communication Path.
U.S. Appl. No. 16/388,258, filed Apr. 18, 2019, Power-Based Encoding of Data to Be Transmitted Over an Optical Communication Path.
U.S. Appl. No. 16/387,791, filed Apr. 18, 2019, Blind Detection Model Optimization.
U.S. Appl. No. 16/387,802, filed Apr. 18, 2019, Error Control Coding With Dynamic Ranges.
U.S. Appl. No. 16/388,373, filed Apr. 18, 2019, Power-Based Encoding of Data to Be Transmitted Over an Optical Communication Path.
U.S. Appl. No. 16/387,813, filed Apr. 18, 2019, Throughput Increases for Optical Communications.
U.S. Appl. No. 16/387,819, filed Apr. 18, 2019, System for Throughput Increases for Optical Communications.
U.S. Appl. No. 16/387,827, filed Apr. 18, 2019, Transmitter for Throughput Increases for Optical Communications.
U.S. Appl. No. 16/387,835, filed Apr. 18, 2019, Unequal Decision Regions for Throughput Increases for Optical Communications.
"Non Final Office Action Issued in U.S. Appl. No. 16/387,802", dated Jun. 22, 2020, 9 Pages.
Cuccato, et al., "Complete and Compact 32-Channel System for Time-Correlated Single-Photon Counting Measurements", In Journal of IEEE Photonics Journal, vol. 5, Issue 5, Oct. 2, 2013, 14 Pages.
"Non Final Office Action Issued in U.S. Appl. No. 16/387,813", dated Apr. 3, 2020, 10 Pages.
"Non Final Office Action Issued in U.S. Appl. No. 16/387,819", dated Apr. 6, 2020, 11 Pages.
"Final Office Action Issued in U.S. Appl. No. 16/388,211", dated Mar. 31, 2020, 16 Pages.
"International Search Report and Written Opinion Issued in PCT Application No. PCT/US2020/024368", dated Jun. 22, 2020, 10 Pages.
"International Search Report and Written Opinion Issued in PCT Application No. PCT/US2020/024325", dated Jun. 18, 2020, 16 Pages.
Hsu, et al., "Multilevel Priority Scheme for Fiber-Optic-Code Division Multiple Access (CDMA) Packet Networks", In Proceedings of IEEE INFOCOM '93 The Conference on Computer Communications, Mar. 29, 1993, pp. 1359-1366.
"Notice of Allowance Issued in U.S. Appl. No. 16/387,813", dated Jul. 23, 2020, 7 Pages.
"International Search Report and Written Opinion Issued in PCT Application No. PCT/US2019/063124", dated Mar. 27, 2020, 11 Pages.
"Non Final Office Action Issued in U.S. Appl. No. 16/388,340", dated May 8, 2020, 20 Pages.
Simon, et al., "Performance Analysis and Tradeoffs for Dual-Pulse PPM on Optical Communication Channels With Direct Detection", In Proceedings of IEEE Transactions on Communications, vol. 52 ,Issue 11, Nov. 1, 2004, pp. 1969-1979.
Feng, et al., "Spectrally overlaid DDO-OFDM transmission enabled by optical power division multiplexing", In Proceedings of 15th International Conference on Optical Communications and Networks (ICOCN), Sep. 24, 2016, 3 Pages.
Han, et al., "Power division multiplexing", in Proceedings of IEEE/CIC International Conference on Communications in China (ICCC), Jul. 27, 2016, 6 Pages.
"International Search Report and Written Opinion Issued in PCT Application No. PCT/US20/024522", dated Jul. 16, 2020, 14 Pages.
"International Search Report and Written Opinion Issued in PCT Application No. PCT/US20/024533", dated Jul. 16, 2020, 12 Pages.
"International Search Report and Written Opinion Issued in PCT Application No. PCT/US20/024534", dated Jul. 16, 2020, 11 Pages.
"International Search Report and Written Opinion Issued in PCT Application No. PCT/US20/024536", dated Jul. 6, 2020, 12 Pages.
Salehi, et al., "Code division multiple-access techniques in optical fiber networks—Part I: Fundamental principles", In Proceedings of IEEE Transactions on Communications, vol. 37,Issue 8, Aug. 1, 1989, pp. 824-833.
"Non Final Office Action Issued in U.S. Appl. No. 16/388,211", dated Aug. 7, 2020, 18 Pages.
Elsherif, et al., "Performance Enhancement of Mapping Multiplexing Technique Utilising Dual-Drive Mach-Zehnder Modulator for Metropolitan Area Networks", In Journal of IET Optoelectronics, vol. 9, Issue 2, Apr. 2015, pp. 108-115.
Linden, et al., "Improvement on Received Optical Power Based Flexible Modulation in a PON by the Use of Non-Uniform PAM", In Proceedings of European Conference on Optical Communication, Sep. 17, 2017, 3 pages.
"International Search Report & Written Opinion Issued in PCT Application No. PCT/US20/014304", dated Jul. 21, 2020, 11 Pages.
"International Search Report & Written Opinion Issued in PCT Application No. PCT/US20/024323", dated Aug. 3, 2020, 11 Pages.
"International Search Report & Written Opinion Issued in PCT Application No. PCT/US20/024328", dated Aug. 3, 2020, 13 Pages.
"International Search Report & Written Opinion Issued in PCT Application No. PCT/US20/024366", dated Jul. 17, 2020, 12 Pages.
"International Search Report & Written Opinion Issued in PCT Application No. PCT/US20/024370", dated Aug. 3, 2020, 12 Pages.
"International Search Report & Written Opinion Issued in PCT Application No. PCT/US20/024535", dated Jul. 6, 2020, 13 Pages.
"International Search Report & Written Opinion issued in PCT Application No. PCT/US20/024529", dated Aug. 7, 2020, 11 Pages.
"Notice of Allowance Issued in U.S. Appl. No. 16/387,791", dated Aug. 28, 2020, 19 Pages.
Khan, et al., "Visible Light Communication using Wavelength Division Multiplexing for Smart Spaces", In Proceedings of the IEEE Consumer Communications and Networking Conference (CCNC), Jan. 14, 2012, pp. 230-234.
"International Search Report and Written Opinion Issued in PCT Application No. PCT/US2019/063121", dated Apr. 1, 2020, 13 Pages.
"Non Final Office Action Issued in U.S. Appl. No. 16/387,827", dated May 27, 2020, 9 Pages.

\* cited by examiner

POWER-BASED DECODING OF DATA RECEIVED OVER AN OPTICAL COMMUNICATION PATH

TECHNICAL FIELD

The subject matter disclosed herein generally relates to optical encoding techniques and, in particular, to using optical power output as a mechanism for encoding repeated binary characters appearing in an encoded bitstream.

BACKGROUND

Optical communication uses light to communicate between an optical transmitter and an optical receiver (e.g., a photodetector). Optical communication is primarily used in telecommunications to communicate large amounts of data (e.g., voice traffic, network traffic, etc.) over large distances between two points. An optical communication path, such as a fiber optic fiber, may carry optical network traffic for hundreds or thousands of devices. As the number of devices increases, so too does the demand for optical communication bandwidth. With the increase in demand for optical communication bandwidth, there also comes a need for new and improved ways of encoding the optical network traffic. By employing different optical encoding schemes, an optical communication path can be improved to carry additional optical network traffic without having to physically alter the optical communication path.

SUMMARY

To address these and other problems that arise within the field of optical communications, this disclosure provides for various optical encoding schemes that leverage transmission power output to encode one or more binary characters. An initial transmission power output may be mapped to a particular binary character, and repeated instances of the particular binary character may be mapped to higher transmission power outputs. As discussed below, various partitioning schemes may be used to efficiently partition a sequence of binary characters into one or more transmission packets, such that these transmission packets are minimized over a predetermined time period.

BRIEF DESCRIPTION OF THE DRAWINGS

Some embodiments are illustrated by way of example and not limitation in the figures of the accompanying drawings.

DETAILED DESCRIPTION

Figure 1:
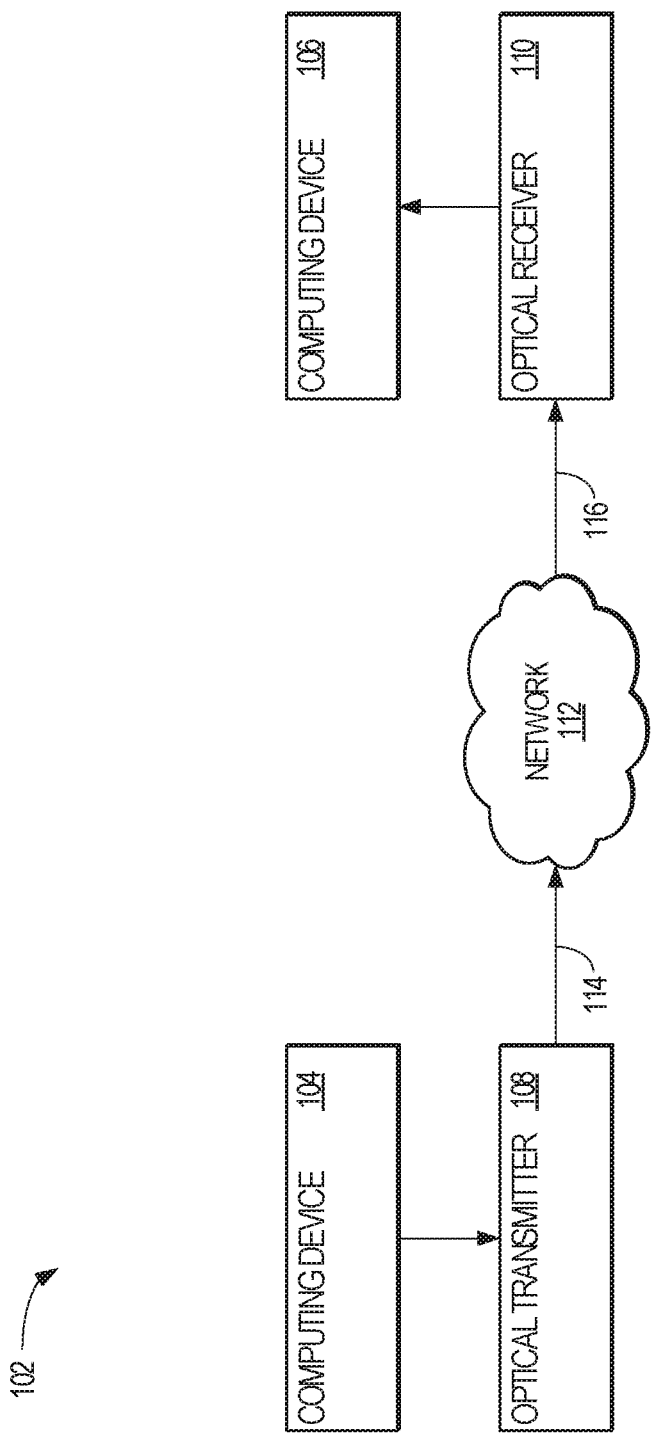
FIG. 1 is a block diagram illustrating an optical transmitter in communication with an optical receiver using one or more optical communication paths, according to an example embodiment.

The description that follows describes systems, methods, techniques, instruction sequences, and computing machine program products that illustrate example embodiments of the present subject matter. In the following description, for purposes of explanation, numerous specific details are set forth in order to provide an understanding of various embodiments of the present subject matter. It will be evident, however, to those skilled in the art, that embodiments of the present subject matter may be practiced without some or other of these specific details. Examples merely typify possible variations. Unless explicitly stated otherwise, structures (e.g., structural components, such as modules) are optional and may be combined or subdivided, and operations (e.g., in a procedure, algorithm, or other function) may vary in sequence or be combined or subdivided.

This disclosure provides systems and methods for optically compressing an encoded bitstream based on the power output of a light source, and selectively activating the light source to transmit the compressed bitstream. This disclosure also provides for systems and methods for optically detecting the transmission of the compressed bitstream, and decompressing the compressed bitstream to obtain the encoded bitstream.

In one embodiment, the disclosed systems and methods obtain the encoded bitstream by encoding data to be optically transmitted using a source coding technique, such as Huffman coding, Lempel-Ziv coding, Shannon-Fano coding, any other source coding technique, or combinations thereof. In another embodiment, source coding on the data to be transmitted is omitted and/or bypassed.

Forward error correction (FEC) may then be performed on the encoded bitstream to preserve information that may be lost during transmission. Examples of error-correction coding techniques that may be applied to the encoded bitstream include Hamming codes, Reed Solomon codes, and other such error-correction coding techniques. The result of the FEC being performed on the encoded bitstream is the encoded bitstream along with redundant bits for recovering one or more of the bits of the encoded bitstream.

A power-shaping or power-based compression algorithm is then performed on the encoded bitstream, including the data portion of the encoded bitstream and the redundant bits added to the encoded bitstream by the error-correction coding. As discussed in more detail, one or more power-shaping or power-based compression algorithms may be performed on the encoded bitstream to increase transmission throughput without physical changes to the optical communication path in which the encoded bitstream is transmitted. In general, a power-based compression algorithm maps a binary character of an encoded bitstream to an output power of a light source that transmits the encoded bitstream over the optical communication path. Thereafter, the power-based compression algorithm searches for repeated instances of the binary character in the encoded bitstream and replaces the repeated instances with a single instance of the binary character. However, the replacement binary character is designated to be transmitted at an increased power level that the individual binary characters that the replacement binary character replaces.

For example, suppose that the binary character of "1" is mapped to a first transmission power level of 5 dBm, and that the encoded bitstream to be transmitted is "1 1 1 1 1." Further still, that the power-based compression algorithm introduces an additional 2 dBm for each additional binary character being replaced after the first binary character. Accordingly, in this example, the encoded bitstream of "1 1 1 1 1" is replaced with a single binary character, "1". In addition, rather than designate the five binary is to be transmitted at five separate instances (e.g., $T_1$, $T_2$, $T_3$, etc.) at a power level of 5 dBm each, the light source is instructed to transmit a single binary character of "1" at a power level of 13 dBm (e.g., the initial 5 dBm for the first binary character, and then an additional 2 dBm for each additional binary character) at a single time period (e.g., $T_1$). When the receiver detects the increased power level of the received transmission packet at the single time period, the receiver applies a power-based decompression algorithm to determine that the received transmission packet represents multiple binary characters, and determines the number of binary characters represented by the single transmission packet.

The foregoing power-based compression algorithm is thus one example of one way in which binary characters may be compressed and represented by the power output of a single transmission packet. As discussed below with reference to FIGS. 4-6, variations on the foregoing example are possible and are contemplated as falling within the scope of this disclosure. Variations include, but are not limited to, accounting for the maximum transmission power output by the light source, optimizing the number of packets that could be transmitted at a power level less than the maximum transmission power, the manner in which the power level for the power-shaped transmission packet is determined, and other such variations or combinations thereof.

Additional operations are then performed on the power-shaped, encoded bitstream prior to transmission by the light source. These operations include, but are not limited to, applying a modulation scheme to modulate the power-shaped, encoded bitstream with a predetermined carrier wave, and up-converting the modulated signal to a frequency suitable for transmission over the optical communication path.

Similar operations are then performed by a receiver that receives the modulated signal from the transmitter. These operations include, but are not limited to, downconverting the received modulated signal to the carrier wave frequency, demodulating the power-shaped, encoded bitstream from the carrier wave, and decompressing the power-shaped, encoded bitstream using a power-based decompression algorithm. Further operations include applying a source decoding technique (e.g., Huffman decoding) to obtain the decoded data, and then storing the decoded data in a computer-readable storage device. Storing the decoded data may include storing the decoded data in short-term memory, such as Random Access Memory (RAM), or in long-term memory, such as on a hard drive (e.g., a magnetic or flash-memory disc), optical disc, or other long-term memory.

An additional technique disclosed herein is that the receiver can be trained, via one or more machine-learning techniques, to recognize whether the transmission packet sent by the optical transmitter represents a single binary character or more than one binary character. One example of a machine-learning technique that may be used by the optical receiver is a Poisson Regression, which is disclosed in the online article "Progression Regression," published by the Microsoft Corp., and available at https://docs.microsoft-.com/en-us/azure/machine-learning/studio-module-reference/poisson-regression#technical-notes. The machine-learning technique assists the receiver in learning the power levels of the transmission packets sent by the transmitter and recognizing when a series of photons received at a particular power level (or approximate power level) represent a transmission packet sent by the optical transmitter. In yet another embodiment, a Poisson distribution is developed for the optical transmitter, where a Poisson distribution is developed for one or more transmission power levels output by the optical transmitter, which is then used to match transmission packets emitted by the optical transmitter.

In this manner, this disclosure provides for an optical encoding mechanism that compresses an encoded bitstream using a power-based compression algorithm, as well as an optical decoding mechanism that decompresses the encoded bitstream using a power-based decompression algorithm. There are multiple technical benefits to this approach. For example, one technical benefit is an improvement in the transmission rate of an optical communication path without having to physically alter the optical communication path to accommodate additional throughput. Another technical benefit is that the power-based compression algorithm can be applied to traditional transmission equipment without having to add additional transmission hardware or modify the existing transmission hardware, as the focus of the power-based compression algorithm is mapping binary characters to the transmission power levels supported by the transmission equipment.

This disclosure now turns to the various disclosed embodiments that implement the technical aspects described herein. FIG. 1 is a block diagram illustrating two computing devices 104-106 in communication with each other via an optical transmitter 108 and an optical receiver 110. The computing device 104 sends data to the computing device 106 via the optical transmitter 108, which encodes the to obtain an encoded bitstream, and uses a power-based compression algorithm to obtain a compressed bitstream for transmission over optical communication paths 114-116. Optical receiver 110 is configured to receive the power-shaped bitstream from the optical transmitter 108, and communicate the uncompressed and decoded data to the computing device 106.

The optical transmitter 108 may be in direct communication with the optical receiver 110 via one or more optical communication paths 114-116. Additionally, and/or alternatively, a network 112 may be disposed between the optical transmitter 108 and the optical receiver 110, and the optical transmitter 108 and the optical receiver 110 communicate via the optical communication paths 114-116 and the network 112.

The computing device 104 may comprise, but is not limited to, a mobile phone, desktop computer, laptop, portable digital assistant (PDA), smart phone, tablet, ultra book, netbook, laptop, multi-processor system, microprocessor-based or programmable consumer electronic, or any other communication device that a user may utilize to perform various computing tasks (e.g., accessing the Internet, making a phone call, conducting a video conference, etc.). In some embodiments, the computing device 104 may comprise a display module (not shown) to display information (e.g., in the form of user interfaces). In further embodiments, the computing device 104 may comprise one or more of touch screens, accelerometers, gyroscopes, cameras, microphones, global positioning system (GPS) devices, and so forth.

The computing device 106 may comprise, but is not limited to, a mobile phone, desktop computer, laptop, portable digital assistant (PDA), smart phone, tablet, ultra book, netbook, laptop, multi-processor system, microprocessor-based or programmable consumer electronic, or any other communication device that a user may utilize to perform various computing tasks (e.g., accessing the Internet, making a phone call, conducting a video conference, etc.). In some embodiments, the computing device 106 may comprise a display module (not shown) to display information (e.g., in the form of user interfaces). In further embodiments, the computing device 106 may comprise one or more of touch screens, accelerometers, gyroscopes, cameras, microphones, global positioning system (GPS) devices, and so forth.

In addition, the computing device 104 and/or the computing device 106 may be implemented as a server that provides various functionalities and/or computerized services. For example, the computing device 104 and/or the computing device 106 may provide file-hosting services, video streaming services, audio streaming services, webpage hosting services, online gaming services, online banking services or any other computerized service or combination thereof. The computing devices 104-106 may be implemented as a client/server relationship (e.g., computing device 104 is a client device and computing device 106 is a server device), as a peer-to-peer relationship (e.g., computing device 104 is a client device and computing device 106 is a client device), or a server-to-server relationship (e.g., both computing device 104-106 are implemented as servers and communicate with each other to provide various services to one another). In some examples, the computing devices 104 and 106 may include the respective optical transmitters 108 and 110.

The network 112 disposed between the computing device 104 and the computing device 106 may include one or more types of networks. For example, the network 112 may be an ad hoc network, an intranet, an extranet, a virtual private network (VPN), a local area network (LAN), a wireless LAN (WLAN), a WAN, a wireless WAN (WWAN), a metropolitan area network (MAN), a portion of the Internet, a portion of the Public Switched Telephone Network (PSTN), a cellular telephone network, a wireless network, a Wi-Fi network, a WiMAX network, another type of network, or a combination of two or more such networks.

The optical communication paths 114-116 may include one or more physical mediums through which a laser or light is communicated. One example of a transmission medium that may be included in the optical communication path 114-116 is one or more optical fibers, such as single mode optical fiber or multi-mode optical fiber, where the optical fibers comprise glass optical fiber, polymer optical fiber, or combinations thereof. Another example of a transmission medium is a gas, such as air, where the optical transmitter 108 communicates with the optical receiver 110 by sending one or more transmission packets over and/or through the gas.

In FIG. 1, the communication between the optical transmitter 108 and the optical receiver 110 is shown as a unidirectional pathway (e.g., the optical transmitter sends transmission packets to the optical receiver 110). However, in other embodiments, the computing device 106 may also be in communication with an optical transmitter (not shown) that communicates with an optical receiver (not shown) communicatively coupled to the computing device 104. Thus, the communication between the computing device 104 and the computing device 106 may also be a bi-directional communication pathway.

Figure 2:
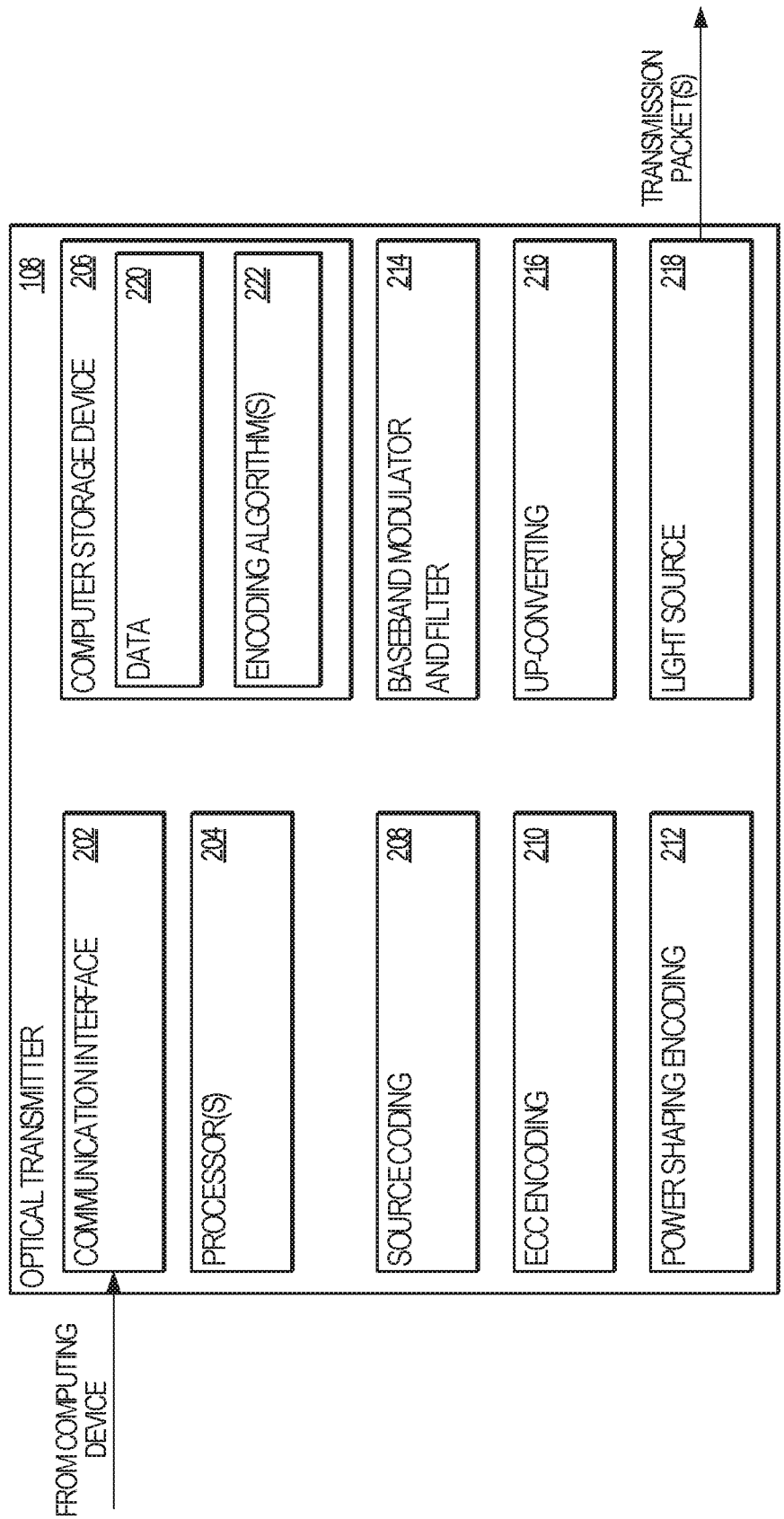
FIG. 2 illustrates the components of the optical transmitter shown in FIG. 1, according to an example embodiment.

Referring to FIG. 2 are the components of the optical transmitter 108 shown in FIG. 1, according to an example embodiment. As shown in FIG. 2, and in one embodiment, the optical transmitter 108 includes various components 202-218. These components 202-218 include, but are not limited to, a communication interface 202, one or more processor(s) 204, a computer storage device 206, a source coding module 208, an error control coding (ECC) module 210, and a power shaping encoding module 212. The components 202-218 further include a baseband modulator/filter 214, an up-converting module 216, and a light source 218.

The various component 202-218 of the optical transmitter 218 may be implemented in a single device may reside on a single device or may be distributed across several devices in various arrangements. The various components 202-218 of the optical transmitter 218 may access one or more computer storage devices for configuration information and/or implementation algorithms, and each of the various components 202-218 may be in communication with one another (e.g., via one or more communication buses or the like). Further, while the components 202-218 of FIG. 2 are discussed in the singular sense, it will be appreciated that in other embodiments multiple instances of the components 202-218 may be employed.

One or more of the components 208-218 may be implemented in hardware and/or software. In one embodiment, the components 208-218 are implemented as dedicated circuits, such as Application Specific Integrated Circuits (ASICs) where the dedicated circuits are configured to perform predetermined functions. For example, the source coding module 208 may be implemented as an ASIC configured to perform Huffman coding on the bitstream corresponding to data 220. As another example, the ECC module 210 may be implemented as an ASIC configured to implement Reed Solomon codes on the encoded bitstream output by the source coding module 208. Additionally, and/or alternatively, the components 208-218 may be implemented as software, where the processor(s) 204 are configured to execute computer-readable instructions that implement the components 208-218. Furthermore, combinations of the foregoing are possible, where some modules are implemented as dedicated circuits and other modules are implemented in software. In this manner, the optical transmitter 108 may include components 208-218 that are implemented in hardware and/or software.

The communication interface 202 is configured to communicate with the computing device 104. In this regard, communication with the computing device 104 includes receiving data from the computing device 104 and/or sending data to the computing device 104. The optical transmitter 108 may also receive instructions and/or configurations from the computing device 104 via the communication interface 202. For example, the optical transmitter 108 may receive data 220 and/or one or more encoding algorithm(s) 222 from the computing device 104.

The communication interface 202 may include one or more wired and/or wireless communication interfaces. For example, the communication interface 202 may include a wireless transceiver, a Bluetooth® radio, and/or a wired network interface. In one embodiment, the communication interface 202 is configured to establish a wireless communication channel with the computing device 104 using one or more wireless communication protocols such as 802.11 b/g/n. Additionally, and/or alternatively, the optical transmitter 108 may establish a communication channel with the computing device 104 via a wire or other physical medium (e.g., via an Ethernet cable or the like). In yet another embodiment, the communication interface 202 is a local bus, which allows direct communication between the optical transmitter 108 and the computing device 104.

The processor(s) 204 are configured to execute computer-readable instructions that implement one or more of the modules 208-216. Additionally, and/or alternatively, the processor(s) 204 may be configured to retrieve computer-readable instructions from the computer storage device 206. The one or more processor(s) 204 may be any type of commercially available processor, such as processors available from the Intel Corporation, Advanced Micro Devices, Texas Instruments, or other such processors. Further still, the one or more processor(s) 204 may include one or more special-purpose processors, such as a Field-Programmable Gate Array (FPGA) or an Application Specific Integrated Circuit (ASIC). The one or more processor(s) 204 may also include programmable logic or circuitry that is temporarily configured by software to perform certain operations. Thus, once configured by such software, the one or more processor(s) 204 become specific machines (or specific components of a machine) uniquely tailored to perform the configured functions and are no longer general-purpose processor(s) 204.

Where the one or more processor(s) 204 implement the modules 208-216 via one or more computer-readable instructions, the computer-readable instructions may be written in one or more computer-programming and/or computer-scripting languages. Examples of such languages include, but are not limited to, C, C++, C#, Java, JavaScript, Perl, Python, or any other computer programming and/or scripting language now known or later developed.

The optical transmitter 108 may further include various computer storage device(s) 206 and/or computer-readable medium(s) for storing the data 220 and/or encoding algorithm(s) 222. The computer storage device 204 includes one or more physical devices configured to store instructions and data temporarily or permanently and may include, but not be limited to, random-access memory (RAM), read-only memory (ROM), buffer memory, flash memory, optical media, magnetic media, cache memory, other types of storage (e.g., Erasable Programmable Read-Only Memory (EEPROM)) and/or any suitable combination thereof. The term "computer storage device" should be taken to include a single device or multiple devices (e.g., a centralized or distributed database, or associated caches and servers) able to store the data 220 and the one or more encoding algorithm(s) 222. Accordingly, the computer storage device 204 may be implemented as a single storage apparatus or device, or, alternatively and/or additionally, as "cloud-based" storage systems or storage networks that include multiple storage apparatus or devices.

The data 220 of the computer storage device 206 includes the information that the computing device 104 intends to transmit to the computing device 106. The data 220 may also include computer-readable instructions that configure the one or more processor(s) 204 to implement one or more of the modules 208-216.

The encoding algorithm(s) 222 include one or more algorithms for encoding the data 220 to be transmitted via the light source 218. In one embodiment, the encoding algorithm(s) 222 include one or more source coding algorithms for implementation by the source coding module 208. Examples of source coding algorithms that may be included in the encoding algorithm(s) 222 include Huffman coding, Lempel-Ziv coding, Shannon-Fano coding, and other such coding algorithms or combinations thereof.

In another embodiment, the encoding algorithm(s) 222 include one or more error-correction coding algorithms that are applied by the ECC module 210. For example, the ECC module 210 may reference a memory address of the computer storage device 206 to retrieve the error-control coding algorithm to apply to an encoded bitstream. Alternatively, the ECC module 210 may reference a variable name, which may store a variable value or a constant value, where the value referenced by the variable name indicates the error-control coding algorithm to apply. The error-control coding algorithms applicable by the ECC module 210 may include, but are not limited to, Hamming codes, Reed Solomon codes, and other such error-correction coding techniques, or combinations thereof.

In another embodiment, the encoding algorithm(s) 222 include one or more power-based compression algorithms for the power shaping encoding module 212. In one embodiment, the power-based compression algorithms map repeated runs of a binary character within the encoded bitstream (e.g., a bitstream where a source coding was applied) to particular power levels transmittable by the light source 218. In one embodiment, the power-based compression algorithms map the repeated runs of the binary character to a power level regardless of the transmission output of the light source 218. In another embodiment, the power-based compression algorithms map repeated runs of the binary character to a predetermined transmittable power output of the light source 218 and, in doing so, generates one or more transmission packets corresponding to the repeated runs of the binary character. In some instances, the predetermined transmittable power output of the light source 218 is the maximum transmittable power output of the light source 218.

In some instances, the run of repeated binary characters includes a repeated "1" value (e.g., "1 1 1," "1 1 1 1," "1 1 1 1 1," etc.). In other instances, the run of repeated binary characters includes a repeated "0" value (e.g., "0 0 0," "0 0 0 0," "0 0 0 0 0," etc.). The power-based compression algorithms may include one or more algorithms for performing power-based compression on repeated "1" values, one or more algorithms for performing power-based compression on repeated "0" values, or combinations of such algorithms.

In mapping the repeated runs of the binary character to power levels output transmittable by the light source 218, each repeated binary character in a run increases the power level at which the replacement binary character is transmitted. For example, a run of binary characters comprising four "1s" may map to a power level that has been increased four times by a predetermined amount (e.g., 0.5 dBm, 1 dBm, etc.). In this embodiment, the increase of the power level output by the light source 218 correlates to the number of repeated binary characters in a particular run of repeated binary characters.

In another embodiment of mapping the run of binary characters to output power levels, increasing power levels may correlate to additional binary characters in a particular run. Additionally, and/or alternatively, the increasing power levels may be arbitrarily assigned or may be assigned via a human-provided input (e.g., by an operator of the optical transmitter 108. For example, the mapping may define that a run comprising four repeated binary characters is to be output at 8 dBm, a run comprising five repeated binary characters is to be output at 8.6 dBm, a run comprising six repeated binary characters is to be output at 9 dBm, and a run comprising seven repeated binary characters is to be output at 9.3 dBm. In this example, the power levels are increased for each additional binary character added to the repeating run of binary characters, but the increase in the power level is not at equal intervals.

In yet a further embodiment of mapping the run of binary characters to output power levels, the power levels may not incrementally increase, but may be randomly assigned and/or provided by a human operator. For example, the mapping may define that a run comprising four repeated binary characters is to be output at 6 dBm, a run comprising five repeated binary characters is to be output at 5.3 dBm, a run comprising six repeated binary characters is to be output at 7.2 dBm, and a run comprising seven repeated binary characters is to be output at 6.7 dBm. In this example, the power levels are at varying output levels and do not necessarily increase with the addition of another repeated binary character.

In yet a further embodiment, the power-based compression algorithms map repeated runs of the binary character to an optimized number of transmission packets, where the optimized number of transmission packets is based on a predetermined power level transmittable by the light source 218 and the number of packets that would be transmitted at the predetermined power level. In some instances, the predetermined power level is the maximum power level output by the light source 218. Each of these power-based compression algorithms are discussed in turn at FIGS. 4-6. Furthermore, combinations of the foregoing are also possible.

The source coding module 208 is configured to encode the data 220 according to one or more of the encoding algorithm(s) 222. In one embodiment, the source coding module 208 retrieves the data 220 from the computer storage device 206 and applies a source coding algorithm as defined by one or more of the encoding algorithm(s) 222. In another embodiment, the source coding module 208 is preconfigured with a source coding to apply to the data 220. The output generated by the source coding module 208 is an encoded bitstream, which may be stored as part of the data 220 of the computer storage device 206. Additionally, and/or alternatively, the encoded bitstream may be communicated in real-time, or near real-time, to another module 210-216 of the optical transmitter 108, such as the ECC module 210 or power shaping encoding module 212.

The ECC module 210 is configured to apply an error-correction coding to the encoded bitstream output by the source coding module 208. In some instances, the data 220 may not be encoded by the source coding module 208, in which case, the ECC module 210 applies the error-correction coding to data 220 that the ECC module 210 retrieves from the computer storage device 206. The resulting output from the ECC module 210 is one or more redundant bits that the optical receiver 110 may use to recover one or more information bits transmitted by the light source 218.

The power shaping encoding module 212 is configured to apply a power-based compression algorithm to the encoded bitstream and redundant bits to obtain a power-shaped, encoded bitstream that is eventually output by the light source 218. The power shaping encoding module 212 may be configured to selectively apply the power-based compression algorithm to one or more portions of the encoded bitstream. The output from the power-shaping module 212 is a compressed bitstream where repeated runs of binary characters in the encoded bitstream and/or redundant bits have been replaced with one or more binary characters, depending on the power-based compression algorithm used by the power shaping encoding module 212. As explained above, the replacement one or more binary characters correspond to a transmission power level output by the light source 218.

In one embodiment, the compressed bitstream (including any redundant bits) is communicated to the baseband modulator/filter 214. The baseband modulator/filter 214 modulates a signal corresponding to the compressed bitstream with a carrier signal emitted by the light source 218. The baseband modulator/filter 124 may employ one or more modulation techniques to modulate the compressed bitstream with the carrier signal emitted by the light source 218. Examples of modulation techniques include, but are not limited to, quadrature phase shift keying (QPSK), binary phase shift keying (BPSK), phase-shift keying (PSK), quadrature amplitude modulation (QAM), amplitude- and phase-shift keying (APSK), and other such modulation techniques or combinations thereof. Further still, the carrier signal emitted by the light source 218 may be directly modulated by the baseband modulator/filter 214 wherein the light source 218 is configured to emit a carrier signal when a first binary character is encountered in the compressed bitstream (e.g., a binary "1") and configured to not emit the carrier signal when a second binary character is encountered in the compressed bitstream (e.g., a binary "0").

In addition, the baseband modulator/filter 214 may filter the modulated signal to be emitted by the light source 218 based on a desired wavelength. In one embodiment, the baseband modulator/filter 214 filters the modulated signal to be within a desired wavelength, such as 650 nm, 850 nm, 1300 nm, 1310 nm, and other such wavelengths. In some instances, the filter of the baseband modulator/filter 214 may be applied after the modulated signal has been up-converted to another frequency and/or wavelength. In this manner, the baseband modulator/filter 214 ensures that the signal emitted by the light source 218 is within a desired or selected wavelength.

In some instances, the baseband modulator/filter 214 may be applied to the compressed bitstream output by the power shaping encoding module 212, such as where the compressed bitstream is to be transmitted with a carrier wave signal. In other instances, the power shaping encoding module 212 may communicate the compressed bitstream to the light source 218, where the baseband modulator/filter 214 directly modulates the output of the light source 218.

The up-converting module 216 is configured to apply a frequency up-conversion technique to convert the frequency of the modulated signal (e.g., the modulated signal output by the baseband modulator/filter 214) to a higher or lower frequency to be emitted by the light source 218. In one embodiment, the up-converting module 216 is implemented as a finite impulse response (FIR) interpolator, a cascaded integrator-comb (CIC) compensator, and a CIC interpolator. The input to the up-converting module 216 includes the modulated signal output by the baseband modulator/filter 214 (e.g., the frequency of the modulated signal) and a local oscillator signal, where the output includes a new signal having a frequency within a particular range of a desired frequency (e.g., the sum of the two signals and/or the difference of the two signals). A bandpass filter (not shown) may then be applied to the output signal to select which of the two output signals is desired (e.g., the sum of the two signals or the difference of the two signals).

In some instances, the up-converting module 216 may be applied to the modulated signal where the modulated signal includes a radiofrequency (RF) signal at a lower frequency than desired. In other instances, the up-converting module 216 may be bypassed and the modulated signal may be communicated directly to the light source 218, such as where the modulated signal is within a range of a desired frequency.

The light source 218 is configured to emit a signal output by the power shaping encoding module 212, the baseband modulator/filter 214, and/or the up-converting module 216. In one embodiment, emissions of the light source 218 are divided into transmission packets, where each transmission packet corresponds to a binary value within the compressed bitstream output by the power shaping encoding module 212. In addition, each transmission packet may be associated with a particular power level such that the light source 218 emits a transmission packet at its associated power level. The light source 218 is further configured to emit the transmission packets at known time intervals (e.g., maintained by an internal clock circuit or the like), and an optical receiver (discussed with reference to FIG. 3) is configured to detect the transmission packets at the known time intervals. In this manner, the optical transmitter 108 is configured to emit transmission packets corresponding to the data 220 via one or more optical communication paths 114-116 and/or network 112.

Figure 3:
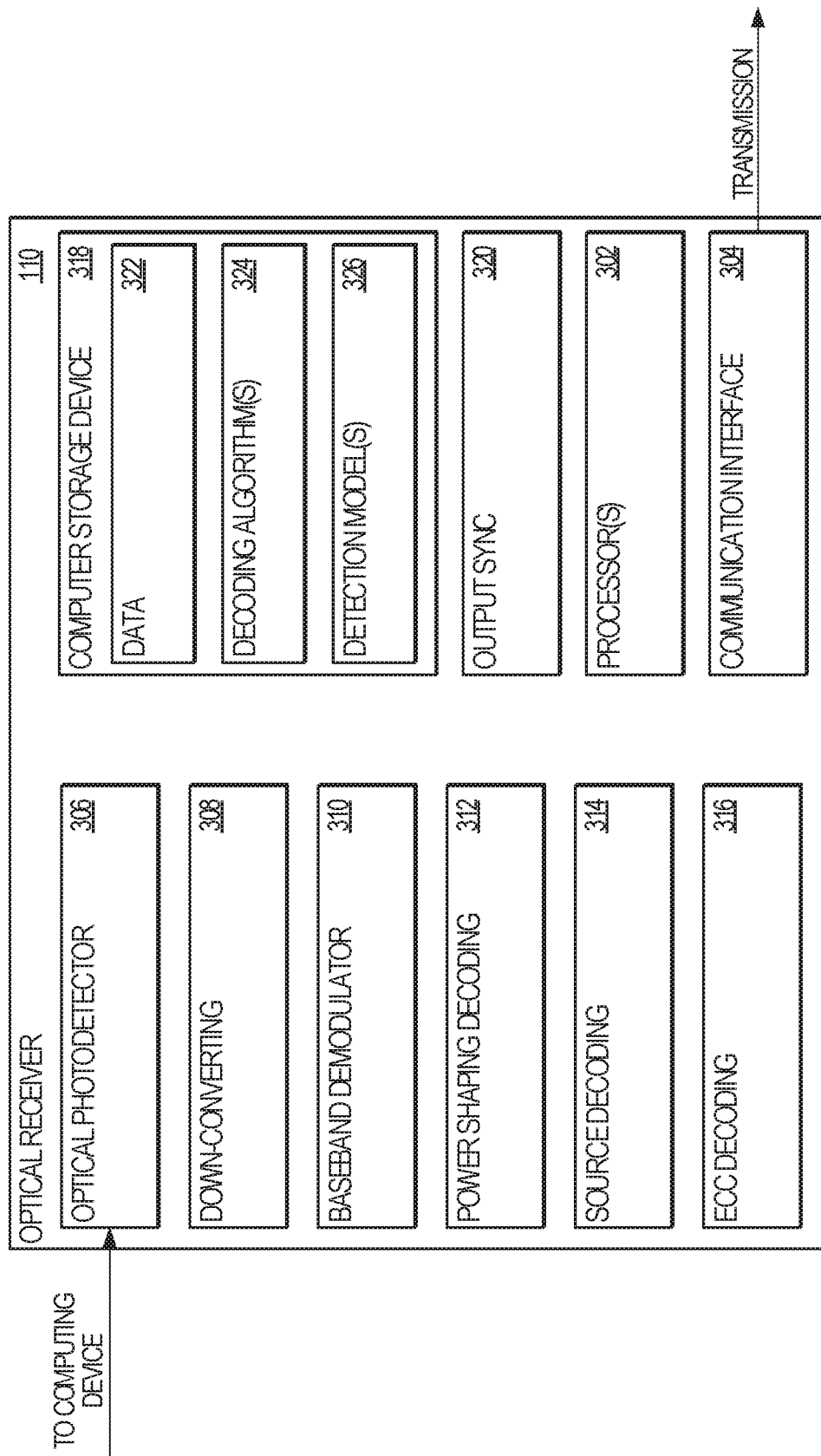
FIG. 3 illustrates the optical receiver of FIG. 1 according to an example embodiment.

Referring to FIG. 3 are the components of the optical receiver 110 shown in FIG. 1, according to an example embodiment. As shown in FIG. 3, and in one embodiment, the optical receiver 110 includes various components 302-318. These components 302-318 include, but are not limited to, one or more processor(s) 302, a communication interface 304, an optical photodetector 306, a baseband demodulator 308, and a power shaping decoding module 312. The components 302-318 further include an ECC decoding module 316, a source decoding module 314, a computer storage device 318, and an output sync 320.

The various component 302-318 of the optical receiver 110 may be implemented in a single device may reside on a single device or may be distributed across several devices in various arrangements. The various components 302-318 of the optical receiver 110 may access one or more computer storage devices for configuration information and/or implementation algorithms, and each of the various components 302-318 may be in communication with one another (e.g., via one or more communication buses or the like). Further, while the components 302-318 of FIG. 3 are discussed in the singular sense, it will be appreciated that in other embodiments multiple instances of the components 302-318 may be employed.

One or more of the components 306-318 may be implemented in hardware and/or software. In one embodiment, the components 306-318 are implemented as dedicated circuits, such as Application Specific Integrated Circuits (ASICs) where the dedicated circuits are configured to perform predetermined functions. For example, the source decoding module 314 may be implemented as an ASIC configured to perform Huffman decoding on the decompressed bitstream obtained by the power shaping decoding module 312. As another example, the ECC decoding module 316 may be implemented as an ASIC configured to decode the compressed bitstream using Reed Solomon codes. Additionally, and/or alternatively, the components 306-318 may be implemented as software, where the processor(s) 302 are configured to execute computer-readable instructions that implement the components 306-318. Furthermore, combinations of the foregoing are possible, where some modules are implemented as dedicated circuits and other modules are implemented in software. In this manner, the optical receiver 110 may include components 306-318 that are implemented in hardware and/or software.

The communication interface 304 is configured to communicate with the computing device 106 and/or the network 112. In this regard, communication with the computing device 106 includes receiving data from the computing device 106 and/or sending data to the computing device 106. The optical receiver 110 may also receive instructions and/or configurations from the computing device 106 via the communication interface 304. For example, the optical receiver 110 may receive data 322, one or more decoding algorithm(s) 324, and one or more detection model(s) 326 from the computing device 106.

The communication interface 304 may include one or more wired and/or wireless communication interfaces. For example, the communication interface 304 may include a wireless transceiver, a Bluetooth® radio, and/or a wired network interface. In one embodiment, the communication interface 304 is configured to establish a wireless communication channel with the computing device 106 using one or more wireless communication protocols such as 802.11 b/g/n. Additionally, and/or alternatively, the optical receiver 110 may establish a communication channel with the computing device 106 via a wire or other physical medium (e.g., via an Ethernet cable or the like). In yet another embodiment, the communication interface 202 is a local bus, which allows direct communication between the optical receiver 110 and the computing device 106.

The processor(s) 302 are configured to execute computer-readable instructions that implement one or more of the modules 306-318. Additionally, and/or alternatively, the processor(s) 302 may be configured to retrieve computer-readable instructions from the computer storage device 318. The one or more processor(s) 302 may be any type of commercially available processor, such as processors available from the Intel Corporation, Advanced Micro Devices, Texas Instruments, or other such processors. Further still, the one or more processor(s) 302 may include one or more special-purpose processors, such as a Field-Programmable Gate Array (FPGA) or an Application Specific Integrated Circuit (ASIC). The one or more processor(s) 302 may also include programmable logic or circuitry that is temporarily configured by software to perform certain operations. Thus, once configured by such software, the one or more processor(s) 302 become specific machines (or specific components of a machine) uniquely tailored to perform the configured functions and are no longer general-purpose processor(s) 302.

Where the one or more processor(s) 302 implement the modules 306-318 via one or more computer-readable instructions, the computer-readable instructions may be written in one or more computer-programming and/or computer-scripting languages. Examples of such languages include, but are not limited to, C, C++, C#, Java, JavaScript, Perl, Python, or any other computer programming and/or scripting language now known or later developed.

The optical receiver 110 may further include various computer storage device(s) 316 and/or computer-readable medium(s) for storing data 322, decoding algorithm(s) 324, and/or one or more detection model(s) 326. The computer storage device 318 includes one or more physical devices configured to store instructions and data temporarily or permanently and may include, but not be limited to, random-access memory (RAM), read-only memory (ROM), buffer memory, flash memory, optical media, magnetic media, cache memory, other types of storage (e.g., Erasable Programmable Read-Only Memory (EEPROM)) and/or any suitable combination thereof. The term "computer storage device" should be taken to include a single device or multiple devices (e.g., a centralized or distributed database, or associated caches and servers) able to store the data 322, the one or more decoding algorithm(s) 324, and/or the detection model(s) 326. Accordingly, the computer storage device 318 may be implemented as a single storage apparatus or device, or, alternatively and/or additionally, as "cloud-based" storage systems or storage networks that include multiple storage apparatus or devices.

The data 322 of the computer storage device 318 includes information received from the computing device 104 via the optical transmitter 108. The data 322 may also include computer-readable instructions that configure the one or more processor(s) 302 to implement one or more of the modules 306-318.

The decoding algorithm(s) 324 include one or more algorithms for decoding the bitstream received from the computing device 104. In one embodiment, the decoding algorithm(s) 324 include one or more source decoding algorithms that are implemented by the source decoding module 314. Examples of source decoding algorithms that may be included in the decoding algorithm(s) 324 include Huffman decoding, Lempel-Ziv decoding, Shannon-Fano decoding, and other such decoding algorithms or combinations thereof.

In another embodiment, the decoding algorithm(s) 324 include one or more error-correction decoding algorithms for decoding one or more redundant bits included in the bitstream transmitted by the optical transmitter 108. Where the ECC decoding module 316 is implemented in hardware, the ECC decoding module 316 310 may be configured to reference a memory address of the computer storage device 318 to retrieve the error-control decoding algorithm to apply to the received bitstream and its included redundant bits. Alternatively, the ECC decoding module 316 may reference a variable name, which may store a variable value or a constant value, where the value referenced by the variable name indicates the error-control decoding algorithm to apply. The error-control decoding algorithms applicable by the ECC decoding module 316 may include, but are not limited to, Hamming codes, Reed-Solomon codes, and other such error-correction coding techniques, or combinations thereof.

In another embodiment, the decoding algorithm(s) 324 include one or more power-based decompression algorithms for the power shaping decoding module 312. In one embodiment, the power-based decompression algorithms map particular power levels detectable by the optical receiver 110 with runs of a repeated binary character within the transmitted bitstream. In one embodiment, the power-based decompression algorithms map the particular power levels to repeated runs of the binary character to a power level regardless of the transmission power detected by the optical receiver 110. In another embodiment, the power-based decompression algorithm maps a predetermined transmittable power output detectable by the optical receiver 110 to repeated runs of the binary character and, in doing so, determines that a transmission packet having the predetermined transmittable power output corresponds to a repeated run of the binary character. In some instances, the predetermined transmittable power output is a maximum transmittable power output.

In mapping the repeated runs of the binary character to power levels detectable by the optical photodetector 306, higher power levels correspond to the number of binary characters that have been repeated. For example, a run of binary characters comprising four "1s" may map to a power level that has been increased four times by a predetermined amount (e.g., 0.5 dBm, 1 dBm, etc.), and the optical photodetector 306 may detect this increase in the power level. In this embodiment, the increases in the power level detected by the optical photodetector 306 correlate to the number of repeated binary characters in a particular run of repeated binary characters.

In another embodiment of mapping the run of binary characters to detected power levels, increasing power levels may correlate to additional binary characters in a particular run. Additionally, and/or alternatively, the increasing power levels may be arbitrarily assigned or may be assigned via a human-provided input (e.g., by an operator of the optical transmitter 108. For example, the mapping may define that a detected power level of 8 dBm correlates to a run comprising four repeated binary characters, a detected power level of 8.6 dBm correlates to a run comprising five repeated binary characters, a detected power level of 9 dBm correlates to a run comprising six repeated binary characters, and a detected power level of 9.3 dBm correlates to a run comprising seven repeated binary characters. In this example, the increasing power levels correlate to an increasing number of repeated binary characters, but the increases in the power level are not at equal intervals.

In yet a further embodiment of mapping the run of binary characters to output power levels, the power levels may not incrementally increase, but may be randomly assigned and/or provided by a human operator. For example, the mapping may define a detected power level of 6 dBm corresponds to a run comprising four repeated binary characters, a detected power level of 5.3 dBm corresponds to a run comprising five repeated binary characters, a detected power level of 7.2 dBm corresponds to a run comprising six repeated binary characters 2 dBm, and a detected power level of 6.7 dBm corresponds to a run comprising seven repeated binary characters. In this example, the power levels are detected at varying levels of output, and higher output levels do not necessarily correlate to the addition of another repeated binary character.

The ways in which a power-based decompression algorithm is applied to the transmitted bitstream is discussed with reference to FIGS. 4-6. Furthermore, combinations of the foregoing are also possible.

The computer storage device 318 is further configured to store one or more detection model(s) 326. The detection model(s) 326 are models the processor(s) 302 use to determine whether a plurality of photons detected by the optical photodetector 306 represent a transmission packet communicated by the optical transmitter 108. In one embodiment, the detection model(s) 326 are developed using a machine-learning technique, such as Poisson Regression, during various phases of transmission by the optical transmitter 108. Although Poisson Regression is provided as one example of a machine-learning technique, other machine-learning techniques, supervised and/or unsupervised, may be employed to build the detection model(s) 326. Examples of supervised machine-learning techniques include Linear Regression, Logistic Regression, Classification and Regression Trees (CART), Naïve Bayes, k-Nearest Neighbor (KNN), and other such supervised machine-learning techniques. Examples of unsupervised machine-learning techniques include Apriori, k-means, Principal Component Analysis (PCA), Bagging with Random Forests, and other such unsupervised machine-learning techniques. Combinations of the foregoing may also be employed to build the detection model(s) 326.

Furthermore, each of the detection model(s) 326 may be associated with a corresponding power-based compression algorithm and/or power-based decompression algorithm. In one embodiment, the power-based compression algorithm is known (e.g., it is communicated by the optical transmitter 108 and/or communicated to the optical transmitter 108), and the selection of the power-based compression algorithm causes a selection of a corresponding detection model (e.g., a detection model that was trained using the selected power-based compression algorithm). In another embodiment, the processor(s) 302 uses the detection model(s) 326 and the incoming transmission from the optical transmitter 108 to determine which detection model best represents the transmission packets communicated by the optical transmitter 108. The determination and selection of the best-fit detection model causes the processor(s) 302 to select a corresponding power-based decompression algorithm from the decoding algorithm(s) 324. In yet another embodiment, a user or operator of the optical receiver 110 instructs the optical receiver 110 to use a particular detection model from the detection model(s) 326.

In building the one or more detection model(s) 326, the optical receiver 110 may be calibrated according to the transmission power levels that can be output by the optical transmitter 108. For example, the optical transmitter 108 may be instructed to emit a plurality of transmission packets at varying power levels (e.g., a base power level and increasingly incremented power levels), and the output of the optical transmitter 108 is measured at predetermined time intervals for the plurality of transmission packets. In this example, the transmission packets are known to occur at the predetermined time intervals with a known transmission power output level. In one embodiment, the measurements correspond to a number of photons detected the predetermined time interval with the predetermined power level. To further build the one or more detection model(s) 326, the optical transmitter 108 may be instructed to transmit the transmission packets a predetermined number of times (e.g., several hundred or several thousand times) until the one or more detection model(s) 326 have stabilized and/or reach a predetermined threshold (e.g., a predetermined probability) that a plurality of photons, emitted at a particular time period with a particular power level, represent a transmission packet communicated by the optical transmitter 108.

As briefly explained above, the optical photodetector 306 is configured to detect a transmission from the optical transmitter 108 via the optical communication path 116 and/or the network 112. In one embodiment, the optical photodetector 306 detects a plurality of photons at one or more power levels at predetermined time intervals. The optical photodetector 306 may communicate this information to the one or more processor(s) 302, where the processor(s) 302 then use one or more of the detection model(s) 326 to determine whether the plurality of photons detected by the optical photodetector 306 correspond to a transmission packet communicated by the optical transmitter 108. In one embodiment, the bitstream that the processor(s) 302 obtain from the optical photodetector 306 is a compressed bitstream, having been compressed by a power-based compression algorithm used by the optical transmitter 108. Using the one or more detection model(s) 326, the processor(s) 302 identify a transmission packet and its associated transmission power level.

In some instances, the transmission from the optical transmitter 108 may need to be down-converted and/or demodulated from a carrier signal. Accordingly, the down-converting module 308 is configured to down-convert the transmission signal from the optical transmitter 108. In one embodiment, the down-converting module 308 is implemented as a digital down-converter and includes a mixer, a CIC decimator, and one or more FIR filters. The inputs to the down-converting module 308 includes the received transmission from the optical transmitter 108 and a local oscillator to compute the intermediate frequency (e.g., the frequency that is output by the down-converting module 308).

In addition, depending on whether the transmission signal has been modulated with a carrier signal, the output from the down-converting module 308 (or the optical photodetector 306) is communicated to a baseband demodulator module 310. The baseband demodulator module 310 demodulates the transmission from the optical transmitter 108 to obtain a compressed bitstream representing data having been compressed by a power-based compression algorithm. The baseband demodulator/module 310 may employ one or more demodulation techniques to demodulate the transmission signal. Examples of demodulation techniques include, but are not limited to, quadrature phase shift keying (QPSK), binary phase shift keying (BPSK), phase-shift keying (PSK), quadrature amplitude demodulation, amplitude- and phase-shift keying (APSK), and other such demodulation techniques or combinations thereof.

In some instances, the down-converting module 308 and/or baseband demodulator 310 may be bypassed by the optical photodetector 306. For example, the processor(s) 302 may determine that the transmission signal has not been upconverted or that the transmission signal has not been externally modulated. In these situations, the optical photodetector 306 may communicate one or more identified transmission packets to the power shaping decoding module 312 for decompression.

The power shaping decoding module 312 is configured to apply a power-based decompression algorithm to the received bitstream to obtain a decompressed bitstream that is eventually communicated to the computing device 106 via the communication interface 304. The power shaping decoding module 212 may be configured to selectively apply the power-based compression algorithm to one or more portions of the encoded bitstream. The output from the power-shaping module 212 is a compressed bitstream where repeated runs of binary characters in the encoded bitstream and/or redundant bits have been replaced with one or more binary characters, depending on the power-based compression algorithm used by the power shaping encoding module 212. As explained above, the replacement one or more binary characters correspond to a transmission power level output by the light source 218.

The source decoding module 314 is configured to decode the uncompressed bitstream obtained by the power shaping decoding module 312 according to one or more of the decoding algorithm(s) 324. In one embodiment, the source decoding module 310 receives the uncompressed bitstream 310 from the power shaping decoding module 312 and, from the manner in which the uncompressed bitstream is coded, determines which decoding algorithm to apply to the uncompressed bitstream. In another embodiment, the source decoding module 310 is preconfigured with the decoding algorithm to apply to the uncompressed bitstream. For example, the optical receiver 110 and/or the optical transmitter 108 may be configured to apply a source encoding and source decoding algorithm using a shared secret key. The output generated by the source decoding module 314 is a decoded bitstream, which may be stored as part of the data 322 of the computer storage device 318. Additionally, and/or alternatively, the decoded bitstream may be communicated in real-time, or near real-time, to another module 306-318 of the optical receiver 110, such as the ECC decoding module 316.

The ECC decoding module 316 is configured to apply an ECC decoding algorithm to the decoded bitstream output by the source decoding module 314. In some instances, a source coding may not have been applied to the decompressed bitstream, in which case, the ECC decoding module 316 applies the ECC decoding algorithm to the decompressed bitstream obtained by the power shaping decoding module 312. In applying the ECC decoding algorithm, the ECC decoding module 316 determines whether there are errors in one or more bits of the decompressed bitstream. Where there are errors, the ECC decoding module 316 corrects the bitstream accordingly. In some instances, the ECC decoding module 316 may request that the optical receiver 110 request a re-transmission of a transmission packet corresponding to the bit having the error. In other instances, the ECC decoding module 316 corrects the bit using the redundant bits that are included with the decompressed bitstream. In this way, the optical receiver 110 can correct for one or more errors that may occur in the bitstream transmitted by the optical transmitter 108.

The output sync 320 is configured to synchronize the output generated by the optical photodetector 306. In one embodiment, the output sync 320 sends timing information to the optical photodetector 306 to ensure that the optical photodetector 306 captures transmission packets at predetermined time intervals. In another embodiment, the output sync 320 may communicate with the processor(s) 302 to ensure that the processor(s) 302 use the correct timing information in determining whether a plurality of photons corresponds to a transmission packet based on one or more of the detection model(s) 326.

After a transmission packet has been decoded and error-corrected (if applicable), the transmission packet may be stored in the computer storage device 318. In one embodiment, the transmission packets are stored in Random Access Memory (RAM) until a predetermined number of transmission packets have been received and decoded by the optical receiver 110. When the predetermined number of transmission packets have been received, a block of data representing the transmission packets may be communicated to the computing device 106 via the communication interface 304.

Figure 4:
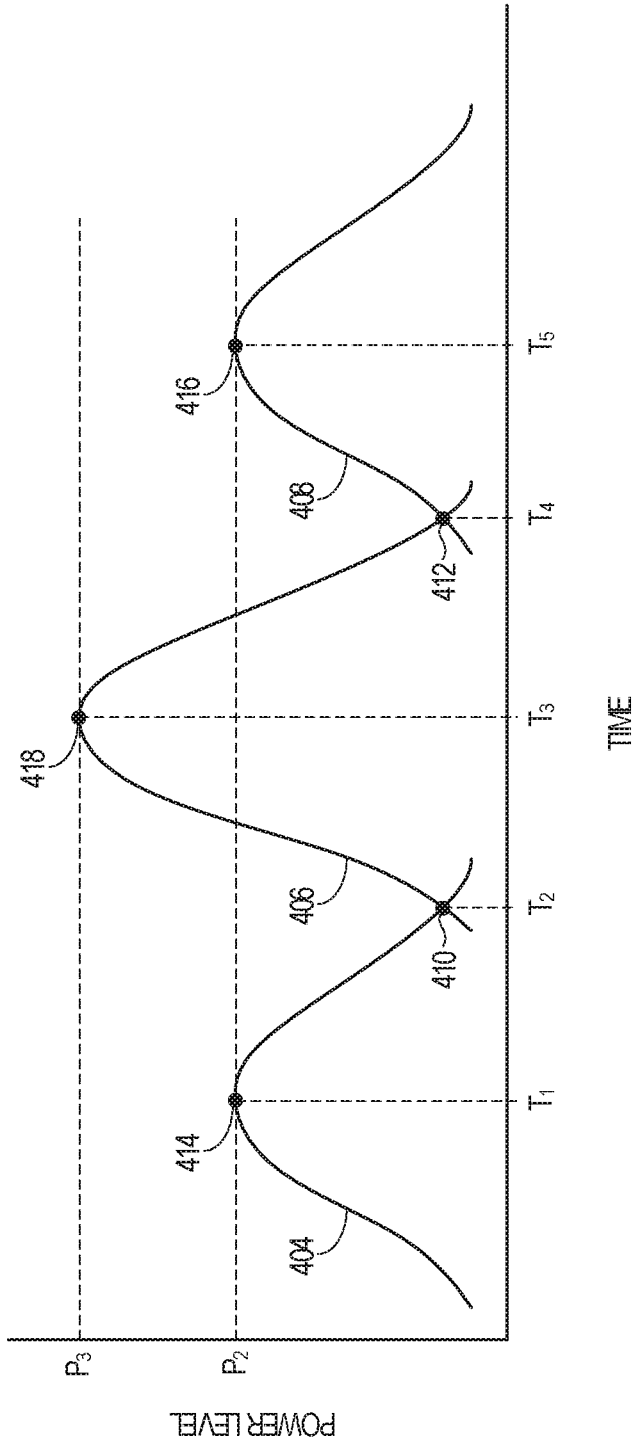
FIG. 4 illustrates a distribution of photons detected by the optical receiver of FIG. 1, where the distribution corresponds to a transmission signal having been compressed using a first power-based compression algorithm, according to an example embodiment.

FIG. 4 illustrates a distribution 402 of photons detected by the optical receiver 108 of FIG. 1, where the distribution 402 corresponds to a transmission signal having been compressed using a first power-based compression algorithm, according to an example embodiment. With reference to FIGS. 2-3, the optical transmitter 108 has been tasked with power-shaping a first encoded bitstream of "1 1 0 1 1 1 0 1 1". In this example, the optical transmitter 108, via the power-shaping encoding module 212, has determined that the encoded bitstream can be compressed into a transmission of five (5) transmission packets, where each transmission packet is transmitted at a predetermined time period (e.g., $T_1$, $T_3$, and $T_5$).

Further in this example, the power-shaping compression algorithm has assigned a power level of P to a single binary character (e.g., the binary value of "1"). In this embodiment, the power level of P may represent the minimum power output of the light source 218 that is detectable by the optical photodetector 306. In another embodiment, P is established as a transmittable power output by the light source 218.

Accordingly, subsequent runs of the binary character are assigned a single binary character having a transmission power level that is a combination of the number of binary characters in the run. In other words, a run of two (2) binary characters is associated with a single binary character having a $P_2$ transmission power, a run of three (3) binary characters is associated with a single binary character having a $P_3$ transmission power, and so forth. In some instances, the successive runs of repeating binary characters are mapped to varying power levels, where each power level is a different power level. In these instances, the power levels may be successive power levels; in other instances, the power levels may be arbitrary and/or randomly assigned.

Where a 0 is encountered in the encoded bitstream, the power-shaping compression algorithm may determine that no power, or minimal power, by the light source 218 is to be emitted. While in FIG. 4, successive runs of binary '1' s are shown as being transmitted at successively increasing power levels, in other examples, other mappings between different run-lengths of binary '1's may be used. For example, $P_2$ may represent "1 1 1" and $P_3$ may represent "1 1". As another example, $P_3$ may represent "1" and $P_2$ may represent "1 1" and $P_3$ may represent "1".

Accordingly, when the optical receiver 110 detects the transmission from the optical transmitter 108, the distribution 402 is encountered. In the distribution 402, there are intermediate distributions of detected photons 404-408 having a range of transmission power levels and there are a greater (e.g., a threshold) number of detected photons 414-418 having a transmission power level of $P_2$ or $P_3$, where $P_2$ and $P_3$ are a combination of the minimum detectable power level P, and $P_3$ is greater than $P_2$. In this regard, the processor(s) 302 may use the detection model(s) 326 to determine that there is a first group of photons 414 at time period $T_1$ having a transmission power level $P_2$, a second group of photons 418 at time period $T_2$ having a transmission power level $P_3$, and a third group of photons 416 at time period $T_3$ having a transmission power level $P_2$. The processor(s) 302 further determine that there are two time periods, time period $T_2$ and time period $T_4$, where a minimal number of photons 410-412 were detected. Using a detection model, the processor(s) 302 assign the first group of detected photons 414 as a first transmission, the second group of detected photons 418 as a second transmission, and a third group of photons 416 as a third transmission. Then, using the power-based decompression algorithm, the power-shaping decoding module 312 determines that the first transmission packet corresponds to two (2) binary 1s, that the second transmission packet corresponds to three (3) binary 1s, and that the third transmission packet corresponds to two (2) binary 1s. This decompressed portion of the transmitted bitstream may then be stored in the computer storage device 318 for later retrieval, or the it may be communicated to the source decoding module 314 for further decoding.

Figure 5:
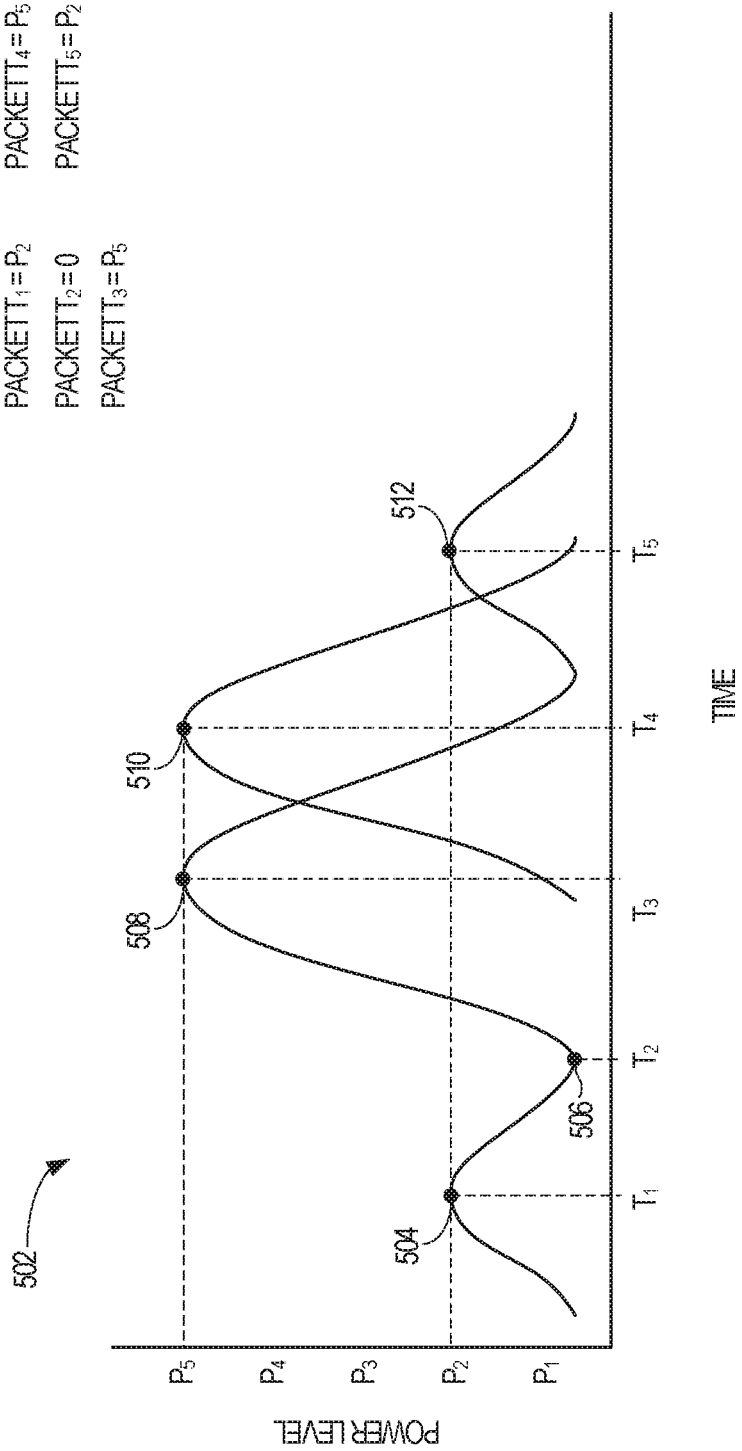
FIG. 5 illustrates a distribution of photons detected by the optical receiver of FIG. 1, where the distribution corresponds to a transmission signal having been compressed using a second power-based compression algorithm, according to an example embodiment.

FIG. 5 illustrates a distribution 502 of photons detected by the optical receiver 108 of FIG. 1, where the distribution 502 corresponds to a transmission signal having been compressed using a second power-based compression algorithm, according to an example embodiment. With reference to FIGS. 2-3, the optical transmitter 108 has been tasked with power-shaping a second encoded bitstream of "1 1 0 1 1 1 1 1 1 1 1 1 1 1 1". In this example, each transmission packet determined by the power-based compression algorithm is associated with a power level that is not to exceed a predetermined transmittable power level of the optical transmitter 108, such as the maximum transmittable power level of the optical transmitter 108. In this example, the predetermined transmission power level output by the optical transmitter 108 is $P_5$, where a power level of P corresponds to a minimum detectable power level. Using this power-based compression algorithm, the optical transmitter 108, via the power-shaping encoding module 212, has determined that the encoded bitstream can be compressed into a transmission of four (5) transmission packets, where each transmission packet is transmitted at a predetermined time period (e.g., $T_1$, $T_3$, $T_4$, and $T_5$). Each transmission packet corresponds to a single binary character, and each transmission packet is associated with a corresponding transmission power level. As noted, in some examples, the predetermined transmittable power level may be a threshold power level that may be the maximum power level the transmitter is configured to transmit at. In other examples, the threshold power level may be set based upon historical past power levels at which the optical transmitter was activated. For example, if a total power level (e.g., the sum of all power levels) transmitted during a particular period of time is above a threshold, the threshold power level may be reduced. This may extend the life of the optical transmitter by reducing the amount at which the optical transmitter transmits at a maximum power level.

Based on the power-shaping compression algorithm, the optical receiver 110 derives the distribution 502. In distribution 502, there are intermediate distributions of detected photons having a range of transmission power levels and there are a greater (e.g., a threshold) number of detected photons 504, 508, 510, and 5123 having a transmission power level greater than $P_2$.

In this regard, the processor(s) 302 use the detection model(s) 326 to determine that there is a first group of photons 504 at time period $T_1$ having a transmission power level $P_2$, a second group of photons 508 at time period $T_3$ having a transmission power level $P_5$, a third group of photons 510 at time period $T_4$ having a transmission power level $P_5$, and a fourth group of photons 512 at time period $T_5$ having a transmission power level of $P_2$. The processor(s) 302 further determine that there is one time period, time period $T_2$ where a minimal number of photons 506 were detected.

Using a detection model, the processor(s) 302 assign the first group of detected photons 504 as a first transmission, the second group of detected photons 508 as a second transmission, the third group of photons 510 as a third transmission, and the fourth group of photons 512 as a fourth transmission. Then, using the power-based decompression algorithm, the power-shaping decoding module 312 determines that the first transmission packet corresponds to two (2) binary 1s, that the second transmission packet corresponds to five (5) binary 1s, and that the third transmission packet corresponds to five (5) binary 1s, and that the fourth transmission packet corresponds to two (2) binary 1s. The processor(s) 302 then reconstruct the encoded bitstream and account for instances where the detected power level was minimal. This decompressed portion of the transmitted bitstream may then be stored in the computer storage device 318 for later retrieval, or the it may be communicated to the source decoding module 314 for further decoding.

Figure 6:
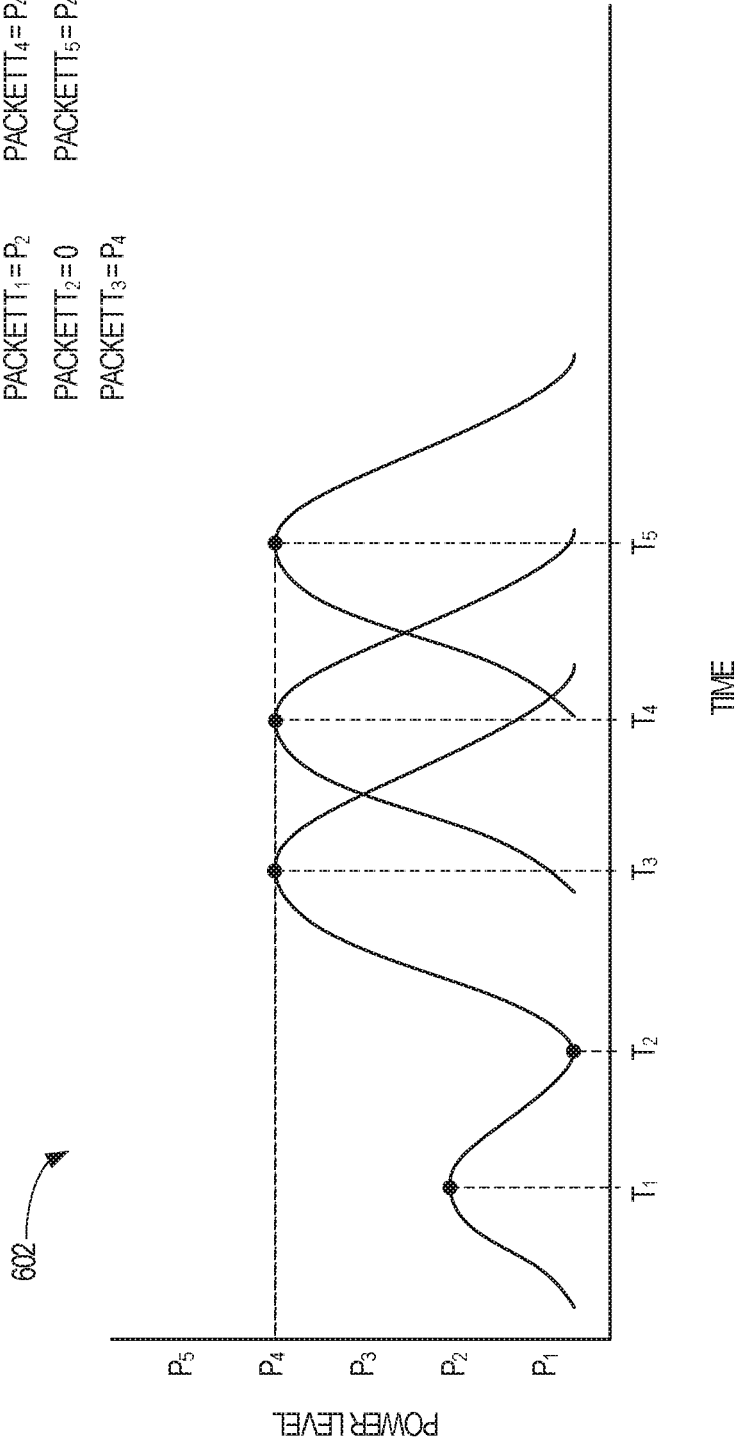
FIG. 6 illustrates a distribution of photons detected by the optical receiver of FIG. 1, where the distribution corresponds to a transmission signal having been compressed using a third power-based compression algorithm, according to an example embodiment.

FIG. 6 illustrates a distribution 602 of photons detected by the optical receiver 108 of FIG. 1, where the distribution 502 corresponds to a transmission signal having been compressed using a third power-based compression algorithm, according to an example embodiment. With reference to FIGS. 2-3, the optical transmitter 108 has been tasked with power-shaping a third encoded bitstream of "1 1 0 1 1 1 1 1 1 1 1 1 1 1". In this example, the power-based compression algorithm derives an optimal number of transmission packets where each transmission packet is less than a predetermined power level output by the optical transmitter 108, such as the maximum power level output by the optical transmitter 108, and the number of transmission packets is minimized over a predetermined time period. In the distribution 602 shown in FIG. 6, the power-based compression algorithm is an optimization algorithm, where the inputs input to the optimization algorithm include an upper limit on the transmission power level (e.g., the maximum power level) and the bitstream for encoding. In one embodiment, the optimization algorithm selects an input power to the optical transmitter 108, where amplification to the input power is in a linear range, which may be the most efficient range. The optimization algorithm groups repeated binary characters, such as '1' bits, such that the power input to the optical transmitter 108 is below a predetermined input threshold. In some instances, the input threshold may change depending on the linearity characteristics of the optical amplification as the optical transmitter 108 ages. The result shown in FIG. 6, where the power-shaped bitstream includes five transmission packets, with the second transmission packet having a minimal transmission power level, is one solution determined by the power-based compression algorithm. The power-based compression algorithm of FIG. 6 may be used to avoid over-driving the light source 218, and to maintain the light source 218 within normal operating parameters.

In some examples, to accomplish this, the transmitter may first packetize the sequence of repeating bits from the bitstream by maximizing a number of bits assignable to each packet while still having a corresponding transmission power for each packet that is not greater than a threshold transmission power. The transmission power of each particular transmission packet determined by applying a mapping of a number of bits in each packet, the mapping comprising a plurality of packet sizes and corresponding power levels, wherein the mapping increases transmission power as the number of bits increase. The transmitter may determine that a first packet of one of the plurality of transmission packets is transmitting at a first power level corresponding to the threshold transmission power and that a second packet of one of the plurality of transmission packets is transmitting at a second power level that is less than the threshold level. In response, the transmitter may move one or more bits from the first packet to the second packet such that the power level of the first packet, as determined by the mapping, is lowered and the second power level of the second packet, as determined by the mapping, is raised such that both the first and second power levels are below the threshold transmission power. This more evenly distributes the power levels (and the bits) within each transmission to lower a peak output of the transmitter.

On the receiver side, the received photons may be decoded and used to create a bitstream. For example, the receiver may detect a first value and a first power level transmitted by a transmitter over the optical communication path at a first timeslot, where the first power level less than a threshold power level. The receiver may then detect the first value and a second power level transmitted by a transmitter over the optical communication path at a second timeslot following the first timeslot. The second power level may also be less than the threshold power level. The fact that two same values at two power levels were received consecutively indicates that the transmitter is applying an optimization algorithm to ensure even distribution of bits and/or power levels. The receiver may then utilize the first and second power levels to determine a bitstream of repeating first values.

Figure 7:
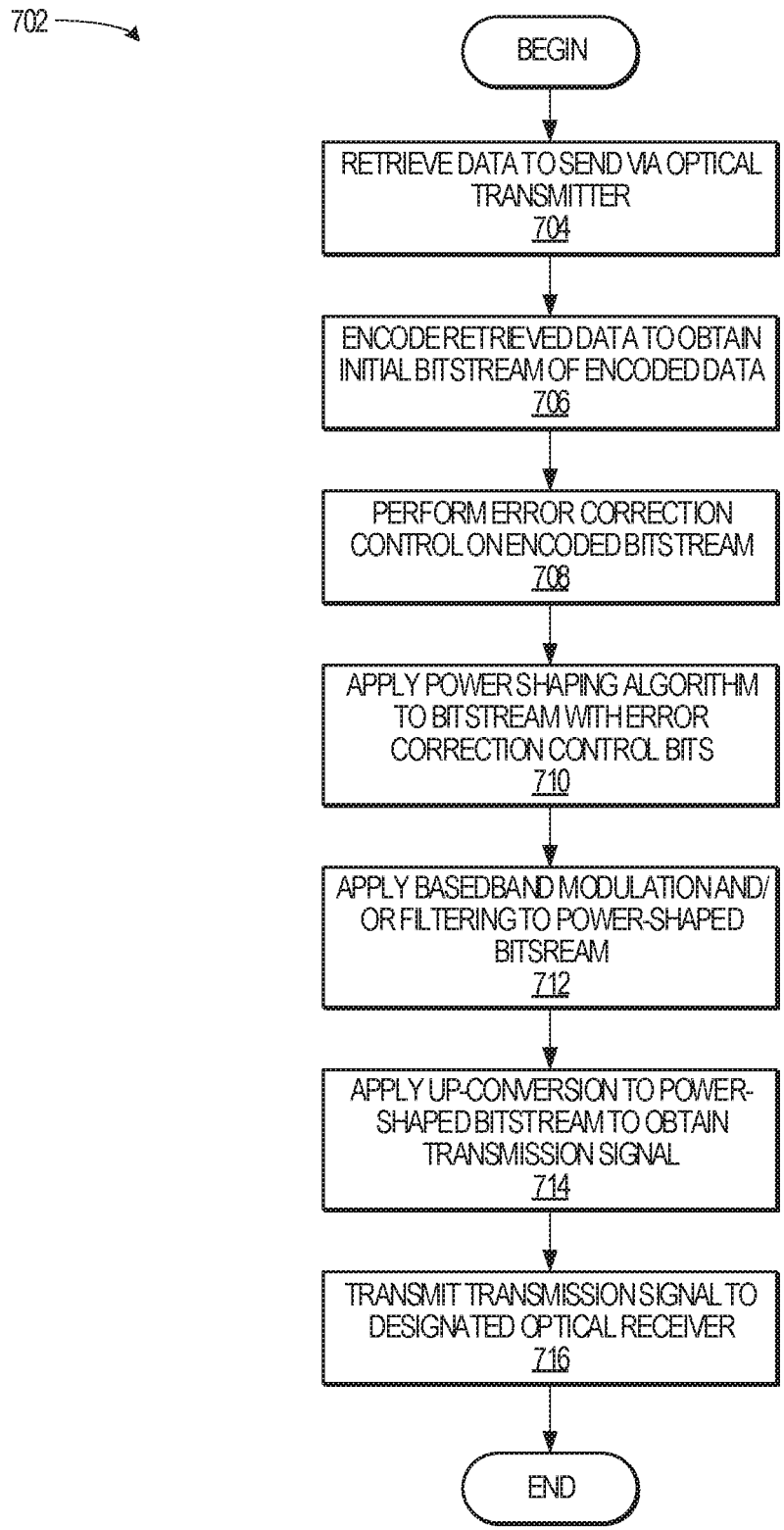
FIG. 7 illustrates a method, in accordance with an example embodiment, for transmitting an encoded bitstream using the optical transmitter of FIG. 1.

FIG. 7 illustrates a method 702, in accordance with an example embodiment, for transmitting an encoded bitstream using the optical transmitter of FIG. 1. The method 702 may be performed by one or more of the components illustrated in FIGS. 2-3, and is discussed by way of reference thereto.

Initially, the optical transmitter 108 receives data 220 to send via the light source 218 through the one or more optical paths 114-116 and/or the network 112 (Operation 704). Thereafter, the source coding module 208 applies a source coding algorithm (using one or more of the encoding algorithm(s) 222) to the data 220 to obtain an encoded bitstream (Operation 706). The source coding module may then communicate the encoded bitstream to the ECC module 210 for applying an ECC algorithm to the encoded bitstream using one or more of the encoding algorithm(s) 222 (Operation 708). In some instances, Operation 706 and/or Operation 708 may be omitted or bypassed, such as where no source coding is to be applied or where ECC is not to be applied to the bitstream.

After the ECC module 210 has completed its operations, the ECC module 210 may then invoke the power-shaping module 212 to apply a power-based compression algorithm to the encoded bitstream and redundant bits, where the power-based compression algorithm is selected from one or more of the encoding algorithm(s) 222 (Operation 710). In one embodiment, the power-shaping encoding module 212 is instructed to select which power-based compression algorithm to apply, such as by receiving an instruction from the computing device 104. In another embodiment, the power-shaping encoding module 212 automatically selects which power-based compression algorithm to apply, such as selecting an algorithm depending on the length of the encoded bitstream. As discussed above, the output of the power-shaping module 212 is a compressed bitstream, where the compressed bitstream includes data from the encoded bitstream as determined by the source coding module 208 and redundant bits as determined by the ECC module 210.

In one embodiment, the power-shaping encoding module 212 then invokes the baseband modulator/filter 214 and/or the up-converting module 216. As discussed above, the baseband modulator/filter 214 is configured to apply a modulation technique to the compressed bitstream (Operation 712). After the baseband modulation/filter 214 is applied, the resulting signal may then be communicated to the up-converting module 216 for up-converting the signal from a first input frequency to a second output frequency (Operation 716). In some instances, however, the baseband modulator/filter 214 and/or the up-converting module 216 may be bypassed. The resulting signal, whether modulated and/or up-converted, is then transmitted by the light source 218 over the one or more optical communication paths. Furthermore, each transmission packet may be associated with a transmission power level, as determined by the power-shaping encoding module 212, where each transmission packet is emitted at the determined transmission power level.

Figure 8:
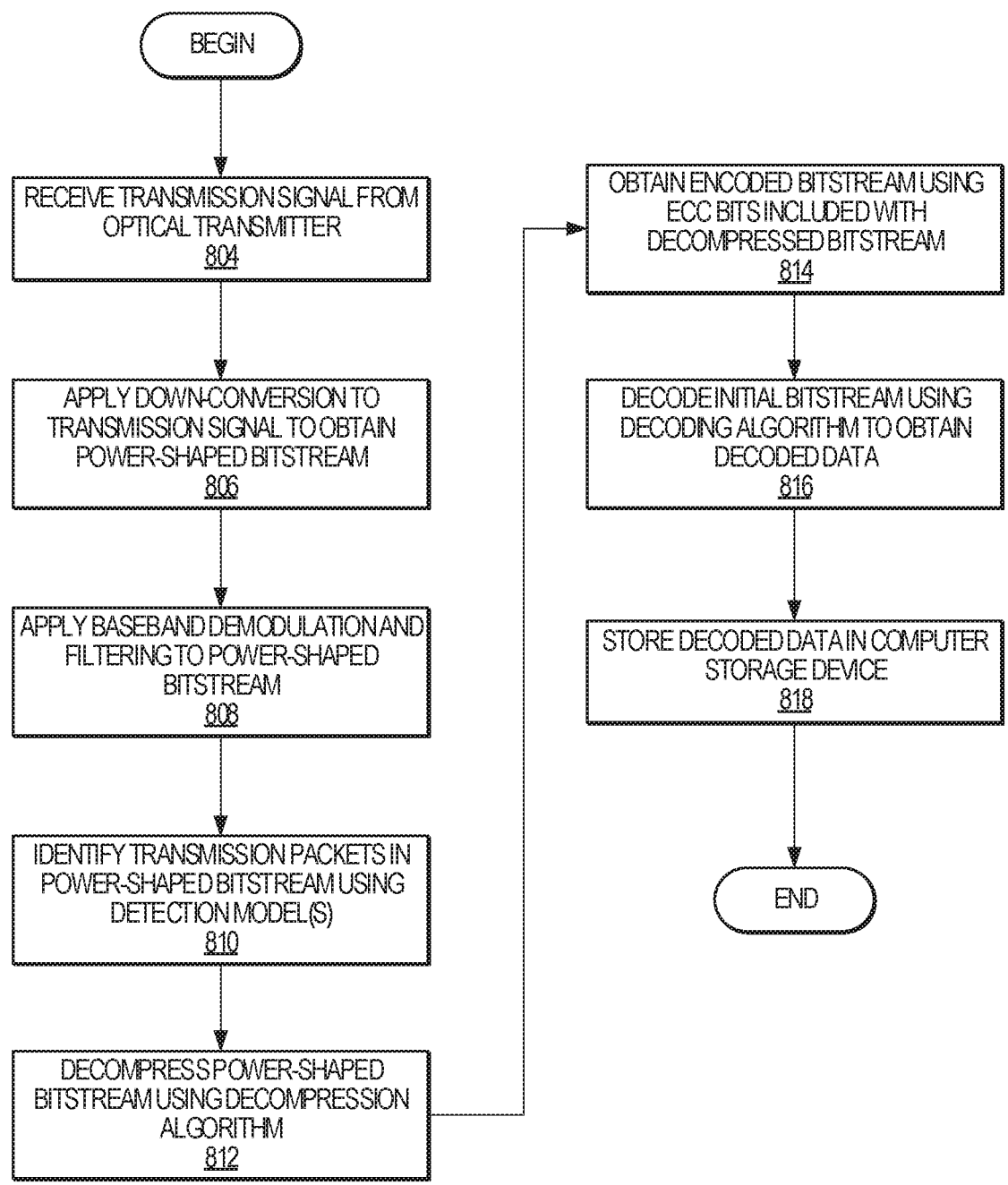
FIG. 8 illustrates a method, in accordance with an example embodiment, for receiving an encoded bitstream using the optical receiver of FIG. 1.

FIG. 8 illustrates a method 802, in accordance with an example embodiment, for receiving an encoded bitstream using the optical receiver of FIG. 1. The method 702 may be performed by one or more of the components illustrated in FIGS. 2-3, and is discussed by way of reference thereto.

Initially, the optical receiver 110 receives a transmission from the optical transmitter 108 via one or more optical communication paths 114-117 and/or network 112 (Operation 804). Depending on whether the transmission has been up-converted, the optical receiver 110 may then execute the down-converting module 308 to down-convert the transmission bitstream from a first frequency to a second frequency (Operation 806). As discussed above, the output from the down-converting module 308 may then be communicated to the baseband demodulator 310, which demodulates an encoded signal (e.g., the power-shaped, compressed bitstream) from a carrier signal (Operation 808). In some instances, the down-converting module 308 and/or the baseband demodulator 310 may be bypassed, in which case, the received transmission signal may be communicated to the power shaping decoding module 312.

The one or more processor(s) 302 may then identify and/or determine whether the transmission signal includes one or more transmission packets (Operation 810). In one embodiment, the one or more processor(s) 302 determines whether a transmission signal includes one or more transmission packets by applying a detection model. As explained above, the detection model may be developed using one or more machine-learning techniques and multiple transmissions made by the optical transmitter 108. The detection model informs the one or more processor(s) 302 whether a particular set of photons, having a determined range of power levels at a predetermined time period, indicates a transmission packet communicated by the optical transmitter 108. As shown in FIGS. 4-6, there may be instances where a transmission packet is associated with a minimal transmission power or a transmission power level within a threshold of a minimum power level, and this type of transmission packet may also represent a binary character and/or value (e.g., a "0" or other binary character).

Having identified the one or more transmission packets of the transmission signal, along with their corresponding transmission power levels, the power shaping decoding module 312 applies a power-based decompression algorithm, selected from the decoding algorithm(s) 324, to decompress one or more of the transmission packets (Operation 812). As shown in FIGS. 4-6, the power shaping decoding module 312 is configured to determine a number of binary characters associated with a transmission packet based on the power level at which the transmission packet was transmitted. As explained previously, the power shaping decoding module 312 may select a particular power-based decompression algorithm based on the detection model(s) 326 used by the processor(s) 302. In another embodiment, the power shaping decoding module 312 receives an instruction as to which power-based decompression module to use. The output from the power shaping decoding module 312 is a bitstream that has been source coded by the source coding module 208 (e.g., an encoded bitstream) along with one or more redundant bits.

The ECC decoding module 316 then determines whether to perform error correction control on the encoded bitstream (e.g., the bitstream output by the power shaping decoding module 312) based on one or more redundant bits included in the bitstream (Operation 814). Thereafter, the source decoding module 314 applies a source decoding algorithm on the encoded bitstream to obtain the initial bitstream corresponding to the data 220 previously stored by the optical transmitter 108 (Operation 816). In one embodiment, the source decoding module 314 is instructed to select a source decoding algorithm from the decoding algorithm(s) 324. In another embodiment, the optical receiver 110 and the optical transmitter 108 are configured to select the same source encoding and/or source decoding algorithms. The output from the source decoding module 314 is decoded data, which may be stored in the computer storage device 318 and/or communicated to the computing device 106 via the communication interface 304 (Operation 818). Further still, there may be instances and/or embodiments where ECC decoding and/or source decoding is not applied to the received transmission signal. For example, where the transmission signal has not been source encoded or where the bitstream has not had ECC encoding applied, then the optical receiver 110 may not perform source decoding and/or ECC decoding on the received transmission signal.

Figure 9:
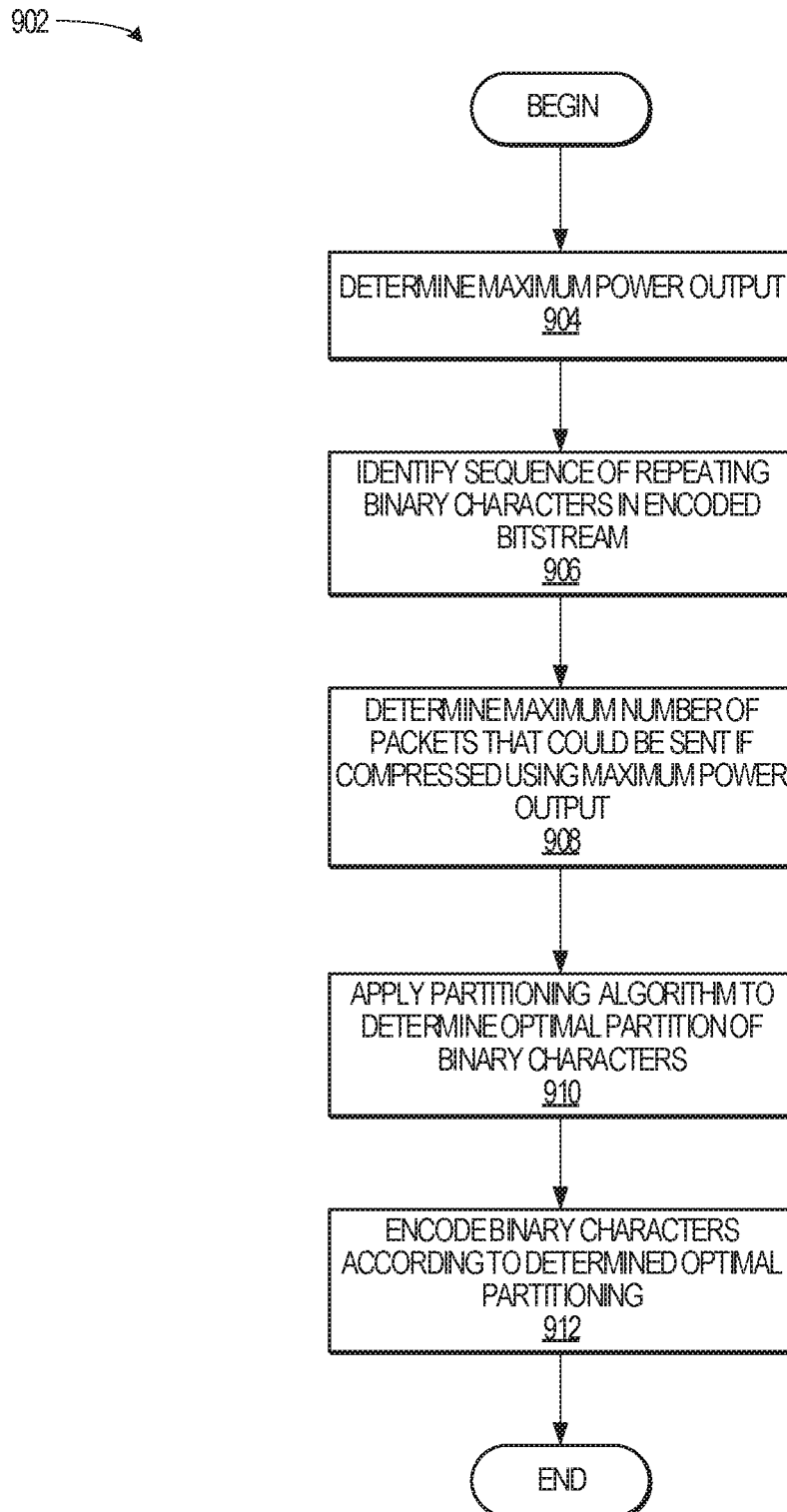
FIG. 9 illustrates a method, in accordance with an example embodiment, for determining an optimal number of transmission packets to send using the optical transmitter of FIG. 1.

FIG. 9 illustrates a method 902, in accordance with an example embodiment, for determining an optimal number of transmission packets to send using the optical transmitter 106 of FIG. 1. The method 902 may be performed by one or more of the components illustrated in FIGS. 2-3, and is discussed by way of reference thereto.

Initially, the processor(s) 204 and/or the power shaping encoding module 212 determine the maximum transmission power output of the light source 218 (Operation 904). Additionally, and/or alternatively, the maximum transmission power output may be provided via an instruction from the computing device 104. The power shaping encoding module 212 then identifies one or more sequences of repeating binary characters in a bitstream (Operation 906). For example, the power shaping encoding module 212 may identify one or more repeating binary characters output by the source coding module 208 and/or the ECC encoding module 210. The power shaping encoding module 212 then determines the number of transmission packets that could be sent representing the repeated runs of the binary character, if each transmission packet could have a maximum transmission power level of the maximum transmission power level output by the light source 218 (Operation 908).

The power shaping encoding module 212 then applies a partitioning algorithm to the encoded bitstream, where the inputs to the partitioning algorithm include the bitstream, the maximum transmission power level that can be output by the light source 218, and the number of transmission packets that could be sent if each transmission packet could be assigned the maximum transmission power level of the light source 218 (Operation 910). In one embodiment, the number of packets determined at Operation 908 serves a lower bound that the partitioning algorithm attempts to achieve and/or approximate (e.g., obtain a value within a predetermined threshold of the number of transmission packets). One example of a partitioning algorithm that may be applied to the encoded bitstream using the foregoing inputs is where the optimization algorithm selects an input power to the optical transmitter 108, where amplification to the input power is in a linear range, which may be the most efficient range. The optimization algorithm groups repeated binary characters, such as '1' bits, such that the power input to the optical transmitter 108 is below a predetermined input threshold. In some instances, the input threshold may change depending on the linearity characteristics of the optical amplification as the optical transmitter 108 ages. Once the optimal number of transmission packets is determined, along with the corresponding transmission power levels, the power shaping encoding module 212 compresses the encoded bitstream to obtain a compressed bitstream for transmission to the optical receiver 110.

Figure 10:
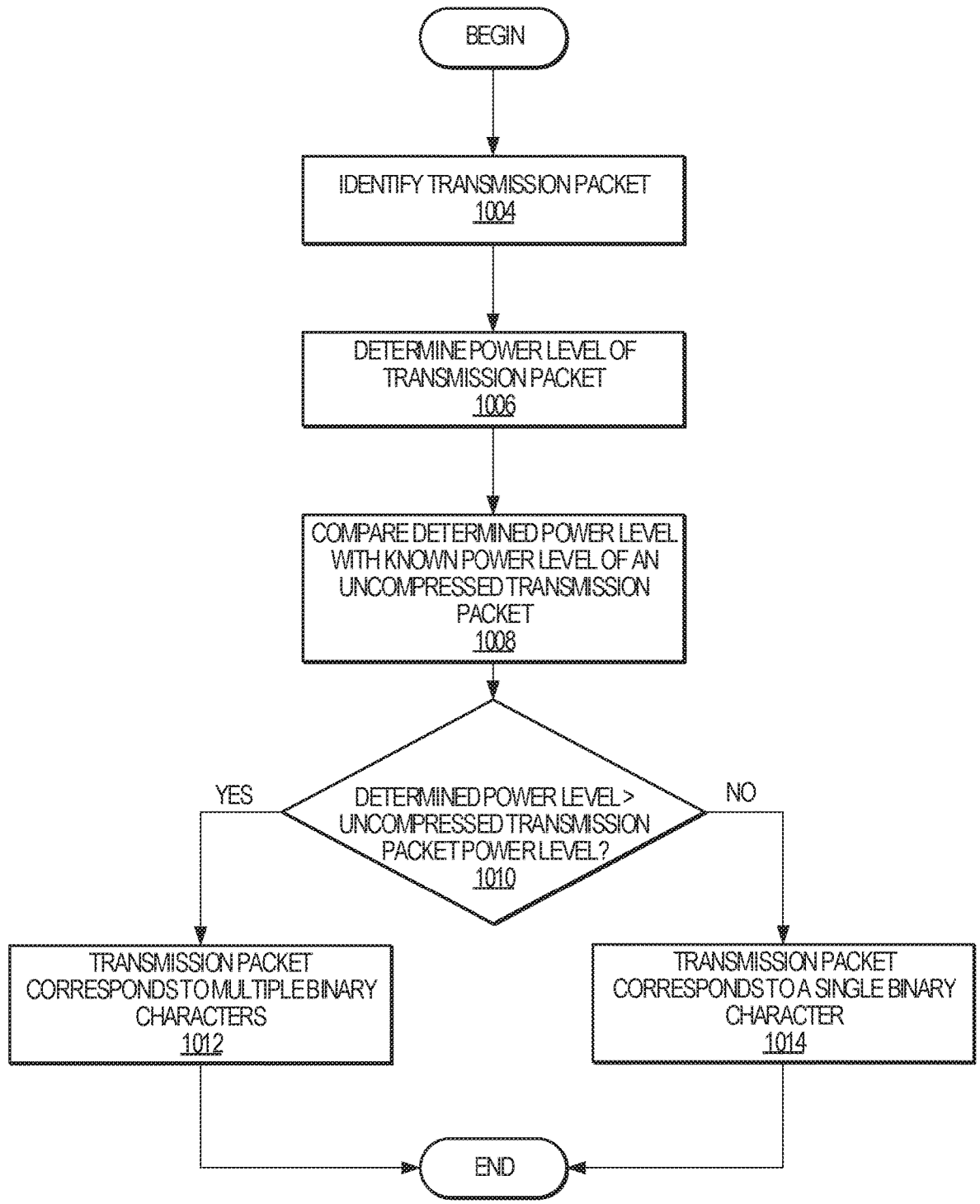
FIG. 10 illustrates a method, in accordance with an example embodiment, for determining whether a transmission packet corresponds to multiple binary characters.

FIG. 10 illustrates a method 1002, in accordance with an example embodiment, for determining whether a transmission packet corresponds to multiple binary characters. The method 1002 may be performed by one or more of the components illustrated in FIGS. 2-3, and is discussed by way of reference thereto.

Initially, the processor(s) 302 and/or the power shaping decoding module 312 identify one or more transmission packets sent by the optical transmitter 108 (Operation 1004). As explained above, the processor(s) 302 may apply one or more detection model(s) 326 to identify transmission packets along with their corresponding transmission power levels (Operation 1006). The power shaping decoding module 328 may then compare the determined power level of a transmission packet of the compressed bitstream with the power level of an uncompressed transmission packet (Operation 1008). This comparison is performed to determine whether a particular transmission packet represents more than one binary character.

Where the power shaping decoding module 328 determines that the power level of a transmission packet of the compressed bitstream is greater than the power level of an uncompressed transmission packet (e.g., the "YES" branch of Operation 1010), the power shaping module 328 determines that the transmission packet represents multiple binary characters (Operation 1012). The power shaping module 328 may apply a power-based decompression algorithm to the transmission packet to obtain the multiple binary characters. Alternatively, where the power shaping decoding module 328 determines that the power level of a transmission packet of the compressed bitstream is less than or equal to the power level of an uncompressed transmission packet (e.g., the "No" branch of Operation 1010), the power shaping module 328 determines that the transmission packet represents a single binary character.

In this manner, the optical transmitter 108 and the optical receiver 110 communicate using a power-based compression algorithm and a power-based decompression algorithm. There are multiple technical benefits to this approach. For example, one technical benefit is an improvement in the transmission rate of an optical communication path without having to physically alter the optical communication path to accommodate additional throughput. Another technical benefit is that the power-based compression algorithm can be applied to traditional transmission equipment without having to add additional transmission hardware or modify the existing transmission hardware, as the focus of the power-based compression algorithm is mapping binary characters to the transmission power levels supported by the transmission equipment. Accordingly, the disclosed systems and methods provide improvements to the field of optical communications and, in particular, the manner in which data is efficiently communicated over an optical communication path.

Certain embodiments are described herein as including logic or a number of components, modules, or mechanisms. Modules may constitute either software modules (e.g., code embodied on a machine-readable medium or machine-readable storage device) or hardware modules. A "hardware module" is a tangible unit capable of performing certain operations and may be configured or arranged in a certain physical manner. In various example embodiments, one or more computer systems (e.g., a standalone computer system, a client computer system, or a server computer system) or one or more hardware modules of a computer system (e.g., a processor or a group of processors) may be configured by software (e.g., an application or application portion) as a hardware module that operates to perform certain operations as described herein.

In some embodiments, a hardware module may be implemented mechanically, electronically, or any suitable combination thereof. For example, a hardware module may include dedicated circuitry or logic that is permanently configured to perform certain operations. For example, a hardware module may be a special-purpose processor, such as a FPGA or an ASIC. A hardware module may also include programmable logic or circuitry that is temporarily configured by software to perform certain operations. For example, a hardware module may include software executed by a general-purpose processor or other programmable processor. Once configured by such software, hardware modules become specific machines (or specific components of a machine) uniquely tailored to perform the configured functions and are no longer general-purpose processors. It will be appreciated that the decision to implement a hardware module mechanically, in dedicated and permanently configured circuitry, or in temporarily configured circuitry (e.g., configured by software) may be driven by cost and time considerations.

Accordingly, the phrase "hardware module" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented module" refers to a hardware module. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software accordingly configures a particular processor or processors, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple hardware modules exist contemporaneously, communications may be achieved through signal transmission (e.g., over appropriate circuits and buses) between or among two or more of the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions described herein. As used herein, "processor-implemented module" refers to a hardware module implemented using one or more processors.

Similarly, the methods described herein may be at least partially processor-implemented, with a particular processor or processors being an example of hardware. For example, at least some of the operations of a method may be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an API).

The performance of certain of the operations may be distributed among the processors, not only residing within a single machine, but deployed across a number of machines. In some example embodiments, the processors or processor-implemented modules may be located in a single geographic location (e.g., within a home environment, an office environment, or a server farm). In other example embodiments, the processors or processor-implemented modules may be distributed across a number of geographic locations.

The modules, methods, applications and so forth described in conjunction with various embodiments described herein are implemented in some embodiments in the context of a machine and an associated software architecture. The sections below describe a representative architecture that is suitable for use with the disclosed embodiments.

Software architectures are used in conjunction with hardware architectures to create devices and machines tailored to particular purposes. For example, a particular hardware architecture coupled with a particular software architecture will create a mobile device, such as a mobile phone, tablet device, or so forth. A slightly different hardware and software architecture may yield a smart device for use in the "internet of things" while yet another combination produces a server computer for use within a cloud computing architecture. Not all combinations of such software and hardware architectures are presented here as those of skill in the art can readily understand how to implement the inventive subject matter in different contexts from the disclosure contained herein.

Figure 11:
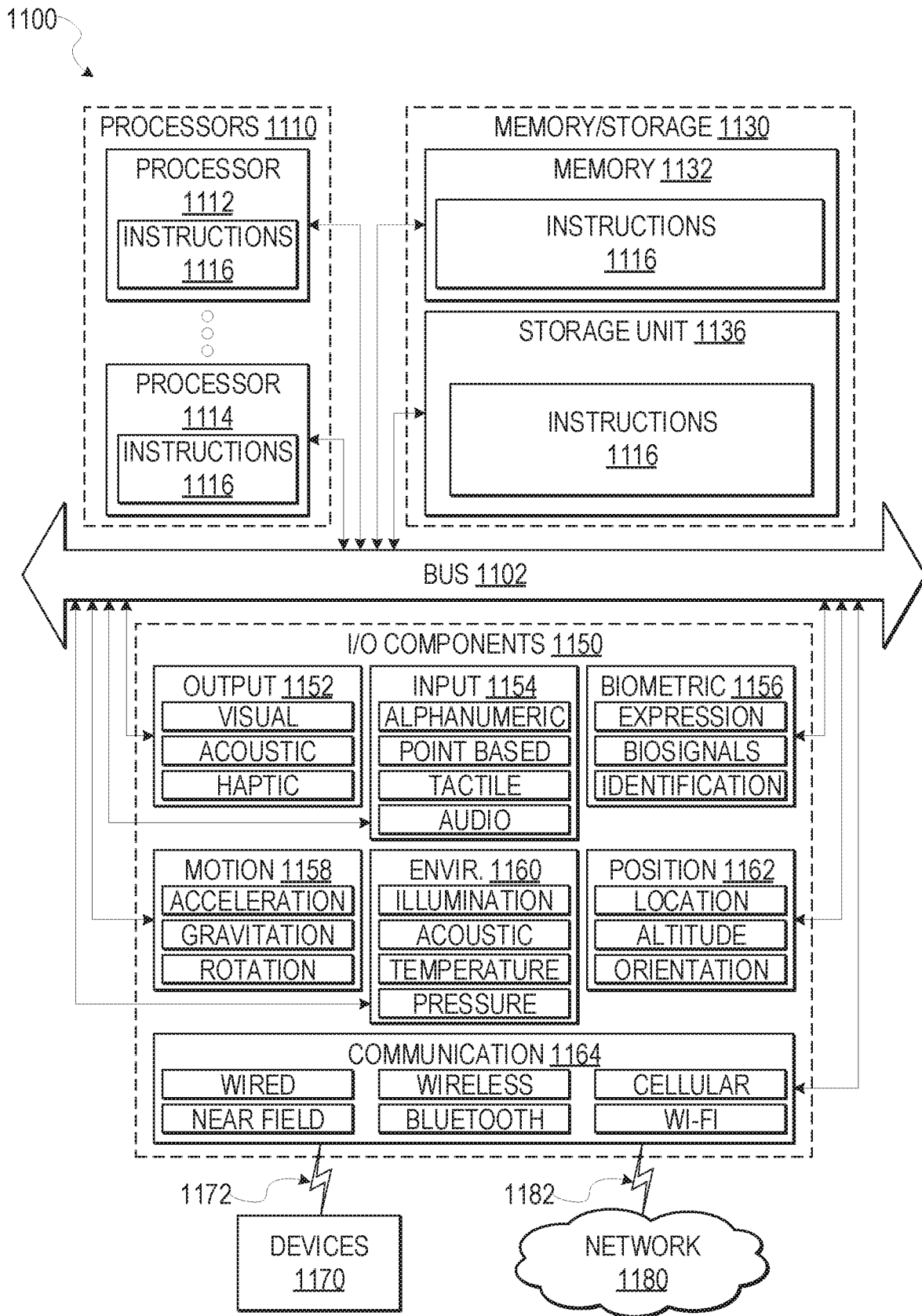
FIG. 11 is a block diagram illustrating components of a machine, according to some example embodiments, able to read instructions from a machine-readable medium (e.g., a machine-readable storage medium or machine-readable storage device) and perform any one or more of the methodologies discussed herein.

FIG. 11 is a block diagram illustrating components of a machine 1100, according to some example embodiments, able to read instructions from a machine-readable medium (e.g., a machine-readable storage medium or machine-readable storage device) and perform any one or more of the methodologies discussed herein. Specifically, FIG. 9 shows a diagrammatic representation of the machine 1100 in the example form of a computer system, within which instructions 1116 (e.g., software, a program, an application, an applet, an app, or other executable code) for causing the machine 1100 to perform any one or more of the methodologies discussed herein may be executed. For example, the instructions 1116 may cause the machine 1100 to execute the methods illustrated in FIGS. 7-10. Additionally, or alternatively, the instructions 1116 may implement one or more of the components of FIGS. 2-3. The instructions 1116 transform the general, non-programmed machine 1100 into a particular machine 1100 programmed to carry out the described and illustrated functions in the manner described. In alternative embodiments, the machine 1100 operates as a standalone device or may be coupled (e.g., networked) to other machines. In a networked deployment, the machine 1100 may operate in the capacity of a server machine or a client machine in a server-client network environment, or as a peer machine in a peer-to-peer (or distributed) network environment. The machine 1100 may comprise, but not be limited to, a server computer, a client computer, a personal computer (PC), a tablet computer, a laptop computer, a netbook, a PDA, or any machine capable of executing the instructions 1116, sequentially or otherwise, that specify actions to be taken by machine 1100. Further, while only a single machine 1100 is illustrated, the term "machine" shall also be taken to include a collection of machines 1100 that individually or jointly execute the instructions 1116 to perform any one or more of the methodologies discussed herein.

The machine 1100 may include processors 1110, memory/storage 1130, and I/O components 1150, which may be configured to communicate with each other such as via a bus 1102. In an example embodiment, the processors 1110 (e.g., a Central Processing Unit (CPU), a Reduced Instruction Set Computing (RISC) processor, a Complex Instruction Set Computing (CISC) processor, a Graphics Processing Unit (GPU), a Digital Signal Processor (DSP), an ASIC, a RadioFrequency Integrated Circuit (RFIC), another processor, or any suitable combination thereof) may include, for example, processor 1112 and processor 1114 that may execute the instructions 1116. The term "processor" is intended to include multi-core processor that may comprise two or more independent processors (sometimes referred to as "cores") that may execute instructions 1116 contemporaneously. Although FIG. 9 shows multiple processors 1110, the machine 1100 may include a single processor with a single core, a single processor with multiple cores (e.g., a multi-core process), multiple processors with a single core, multiple processors with multiples cores, or any combination thereof.

The memory/storage 1130 may include a memory 1132, such as a main memory, or other memory storage, and a storage unit 1136, both accessible to the processors 1110 such as via the bus 1102. The storage unit 1136 and memory 1132 store the instructions 1116 embodying any one or more of the methodologies or functions described herein. The instructions 1116 may also reside, completely or partially, within the memory 1132, within the storage unit 1136, within at least one of the processors 1110 (e.g., within the processor's cache memory), or any suitable combination thereof, during execution thereof by the machine 1100. Accordingly, the memory 1132, the storage unit 1136, and the memory of processors 1110 are examples of machine-readable media.

As used herein, "machine-readable medium" includes a machine-readable storage device able to store instructions 1116 and data temporarily or permanently and may include, but is not limited to, random-access memory (RAM), read-only memory (ROM), buffer memory, flash memory, optical media, magnetic media, cache memory, other types of storage (e.g., Erasable Programmable Read-Only Memory (EEPROM)) and/or any suitable combination thereof. The term "machine-readable medium" should be taken to include a single medium or multiple media (e.g., a centralized or distributed database, or associated caches and servers) able to store instructions 1116. The term "machine-readable medium" shall also be taken to include any medium, or combination of multiple media, that is capable of storing instructions (e.g., instructions 1116) for execution by a machine (e.g., machine 1100), such that the instructions, when executed by one or more processors of the machine 1100 (e.g., processors 1110), cause the machine 1100 to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" excludes signals per se.

The input/output (I/O) components 1150 may include a wide variety of components to receive input, provide output, produce output, transmit information, exchange information, capture measurements, and so on. The specific I/O components 1150 that are included in a particular machine will depend on the type of machine. For example, portable machines such as mobile phones will likely include a touch input device or other such input mechanisms, while a headless server machine will likely not include such a touch input device. It will be appreciated that the I/O components 1150 may include many other components that are not shown in FIG. 8.

The I/O components 1150 are grouped according to functionality merely for simplifying the following discussion and the grouping is in no way limiting. In various example embodiments, the I/O components 1150 may include output components 1152 and input components 1154. The output components 1152 may include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The input components 1154 may include alphanumeric input components (e.g., a keyboard, a touch screen configured to receive alphanumeric input, a photo-optical keyboard, or other alphanumeric input components), point based input components (e.g., a mouse, a touchpad, a trackball, a joystick, a motion sensor, or other pointing instrument), tactile input components (e.g., a physical button, a touch screen that provides location and/or force of touches or touch gestures, or other tactile input components), audio input components (e.g., a microphone), and the like.

In further example embodiments, the I/O components 1150 may include biometric components 1156, motion components 1158, environmental components 1160, or position components 1162 among a wide array of other components. For example, the biometric components 1156 may include components to detect expressions (e.g., hand expressions, facial expressions, vocal expressions, body gestures, or eye tracking), measure biosignals (e.g., blood pressure, heart rate, body temperature, perspiration, or brain waves), identify a person (e.g., voice identification, retinal identification, facial identification, fingerprint identification, or electroencephalogram based identification), and the like. The motion components 1158 may include acceleration sensor components (e.g., accelerometer), gravitation sensor components, rotation sensor components (e.g., gyroscope), and so forth. The environmental components 1160 may include, for example, illumination sensor components (e.g., photometer), temperature sensor components (e.g., one or more thermometer that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 1162 may include location sensor components (e.g., a GPS receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 1150 may include communication components 1164 operable to couple the machine 1100 to a network 1180 or devices 1170 via coupling 1182 and coupling 1172, respectively. For example, the communication components 1164 may include a network interface component or other suitable device to interface with the network 1180. In further examples, communication components 1164 may include wired communication components, wireless communication components, cellular communication components, Near Field Communication (NFC) components, Bluetooth® components (e.g., Bluetooth® Low Energy), Wi-Fi (ID components, and other communication components to provide communication via other modalities. The devices 1170 may be another machine or any of a wide variety of peripheral devices (e.g., a peripheral device coupled via a USB).

Moreover, the communication components 1164 may detect identifiers or include components operable to detect identifiers. For example, the communication components 1164 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF416, Ultra Code, UCC RSS-2D bar code, and other optical codes), or acoustic detection components (e.g., microphones to identify tagged audio signals). In addition, a variety of information may be derived via the communication components 1164, such as location via Internet Protocol (IP) geo-location, location via Wi-Fi (ID signal triangulation, location via detecting a NFC beacon signal that may indicate a particular location, and so forth.

In various example embodiments, one or more portions of the network 1180 may be an ad hoc network, an intranet, an extranet, a VPN, a LAN, a WLAN, a WAN, a WWAN, a MAN, the Internet, a portion of the Internet, a portion of the PSTN, a plain old telephone service (POTS) network, a cellular telephone network, a wireless network, a Wi-Fi® network, another type of network, or a combination of two or more such networks. For example, the network 1180 or a portion of the network 1180 may include a wireless or cellular network and the coupling 1182 may be a Code Division Multiple Access (CDMA) connection, a Global System for Mobile communications (GSM) connection, or other type of cellular or wireless coupling. In this example, the coupling 1182 may implement any of a variety of types of data transfer technology, such as Single Carrier Radio Transmission Technology (1×RTT), Evolution-Data Optimized (EVDO) technology, General Packet Radio Service (GPRS) technology, Enhanced Data rates for GSM Evolution (EDGE) technology, third Generation Partnership Project (3GPP) including 3G, fourth generation wireless (4G) networks, Universal Mobile Telecommunications System (UMTS), High Speed Packet Access (HSPA), Worldwide Interoperability for Microwave Access (WiMAX), Long Term Evolution (LTE) standard, others defined by various standard setting organizations, other long range protocols, or other data transfer technology.

The instructions 1116 may be transmitted or received over the network 1180 using a transmission medium via a network interface device (e.g., a network interface component included in the communication components 1164) and utilizing any one of a number of well-known transfer protocols (e.g., hypertext transfer protocol (HTTP)). Similarly, the instructions 1116 may be transmitted or received using a transmission medium via the coupling 1172 (e.g., a peer-to-peer coupling) to devices 1170. The term "transmission medium" shall be taken to include any intangible medium that is capable of storing, encoding, or carrying instructions 1116 for execution by the machine 1100, and includes digital or analog communications signals or other intangible medium to facilitate communication of such software.

Figure 12:
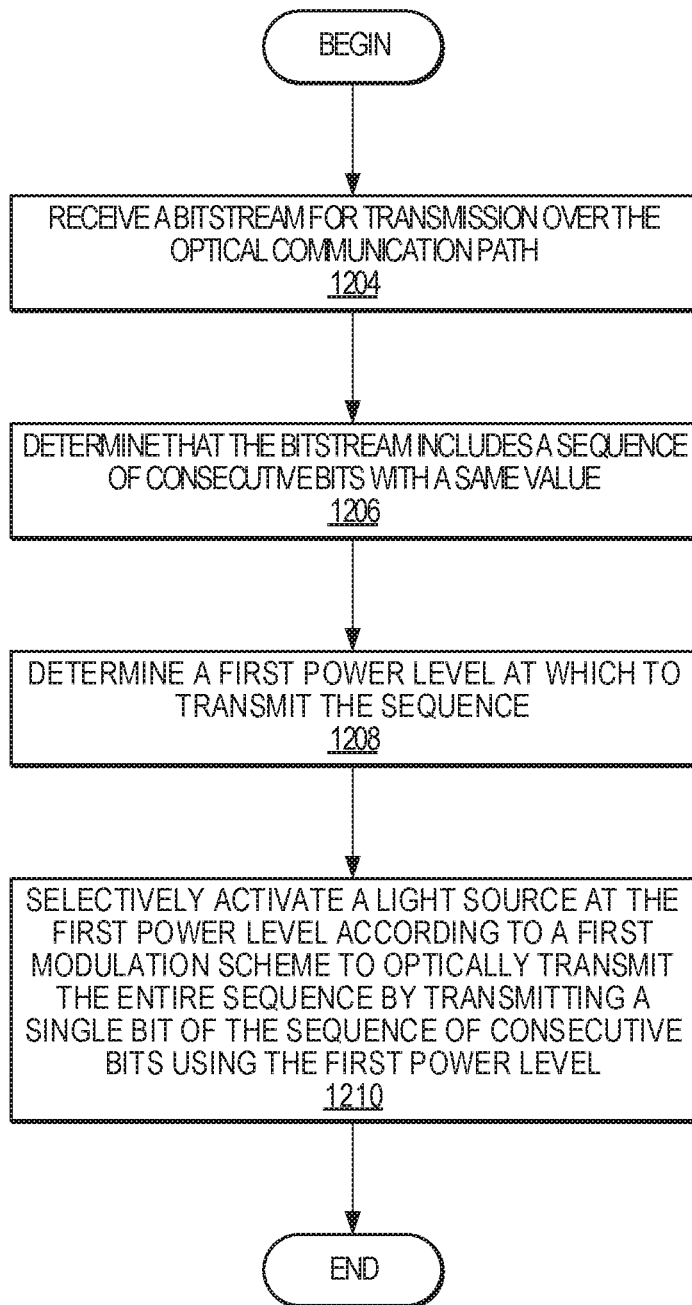
FIG. 12 illustrates a method, in accordance with an example embodiment, for transmitting data over an optical communication path.

FIG. 12 illustrates a method 1202, in accordance with an example embodiment, for transmitting data over an optical communication path. The method 1202 includes an operation 1204 to receive a bitstream for transmission over the optical communication path.

The method 1202 includes an operation 1206 to determine that the bitstream includes a sequence of consecutive bits with a same value. Operation 1206 may include determining a sequence of sequential bits with a same first value in the bitstream, the sequence having a first size with a maximum number of bits while also having a corresponding first transmission power that does not exceed a threshold transmission power, the first transmission power determined by applying a mapping to the first size, the mapping comprising a plurality of sequence sizes and corresponding transmission powers, wherein the mapping increases transmission power as a number of bits increases. The method 1202 may further include determining a second sequence of sequential bits with the same first value in the bitstream, the second sequence having a second size with a maximum number of bits while also having a corresponding second transmission power that is less than a threshold transmission power, the transmission power determined by applying the mapping to the second size, the second transmission power less than the first transmission power and the second size less than the first size. The threshold transmission power may be a maximum power at which a light source is configured to transmit.

The method 1202 includes an operation 1208 to determine a first power level at which to transmit the sequence. In an example, the first power level is determined based on a count of the consecutive bits in the sequence, and wherein count increases are mapped to power level increases. In an example, each bit of the sequence is associated with a corresponding power level. The first power level may be based on a combination of corresponding power levels for each of the values of the sequence.

The method 1202 includes an operation 1210 to selectively activate a light source at the first power level according to a first modulation scheme to optically transmit the entire sequence by transmitting a single bit of the sequence of consecutive bits using the first power level. In an example, operation 1210 requires less energy or time than a total energy or total time required to activate the light source to transmit each bit of the sequence individually. Operation 1210 may include selectively activating the light source at a second power level according to the modulation scheme to optically transmit an entire second sequence by transmitting a single bit of the first same value using a second power level. Operation 1210 may include modulating the single bit on a carrier wave using the first power level. The modulation scheme may include a quadrature phase shift keying (QPSK), binary phase shift keying (BPSK), phase-shift keying (PSK), Quadrature amplitude modulation (QAM), an amplitude and phase shift keying (APSK), or the like. The optical communication path may be a fiber optic. Photons may be transmitted across the fiber optic.

In an example, the count increases are nonlinearly mapped to the power increases. In another example, the count increases are linearly mapped. For example, a second sequence (longer than the first) corresponds to a higher power level, a third sequence (longer than the second) corresponds to a higher power level than the second. In this example, the third power level exceeds the second power level by a predetermined amount (and the second power level also exceeds the first power level by the predetermined amount).

The method 1202 may include receiving the transmitted single bit, and reversing the above steps to determine the count of consecutive bits in a sequence from the power level. The sequence of consecutive bits may be stored as a bitstream in a memory.

The method 1202 may include an operation to packetize the sequence of bits into a plurality of transmission packets by maximizing a number of bits assignable to each packet while still having a corresponding transmission power for each packet that is not greater than a threshold transmission power, the transmission power of each particular packet determined by applying a mapping of a number of bits in each packet, the mapping comprising a plurality of packet sizes and corresponding power levels, wherein the mapping increases transmission power as the number of bits increase. This operation may include determining that a first packet of one of the plurality of transmission packets is transmitting at a first power level corresponding to the threshold transmission power and that a second packet of one of the plurality of transmission packets is transmitting at a second power level that is less than the threshold level. A bit may be moved from the first packet to the second packet, for example such that the power level of the first packet, as determined by the mapping, is lowered and the second power level of the second packet, as determined by the mapping, is raised such that both the first and second power levels are below the threshold transmission power. In this example, operation 1210 may be modified to transmit the single bit at the lowered first power level or the second power level, accordingly. In an example, a threshold power may be based upon historical past power levels at which the light source was activated. In an example, mapping may include mapping a first number of bits to a first power level, a second number of bits greater than the first number of bits to a second power level greater than the first power level and a third number of bits greater than the second number of bits to a third power level greater than the second power level.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

Example 1 is a method for transmitting data over an optical communication path, the method comprising: receiving a bitstream for transmission over the optical communication path; determining that the bitstream includes, a sequence of consecutive bits with a same value; determining a first power level at which to transmit the sequence, wherein the first power level is determined based on a count of the consecutive bits in the sequence, and wherein count increases are mapped to power level increases; and selectively activating a light source at the first power level according to a first modulation scheme to optically transmit the entire sequence by transmitting a single bit of the sequence of consecutive bits using the first power level.

In Example 2, the subject matter of Example 1 includes, wherein each bit of the sequence is associated with a corresponding power level; and wherein the first power level is based on a combination of corresponding power levels for each of the values of the sequence.

In Example 3, the subject matter of Examples 1-2 includes, determining a second power level associated with a second sequence of consecutive bits with the same value, the second sequence having a higher count of consecutive bits than the sequence, and wherein the second power level is higher than the first power level.

In Example 4, the subject matter of Example 3 includes, determining a third power level associated with a third sequence of consecutive bits with the same value, the third power level higher than the second power level, wherein the third power level is higher than the second power level by a predetermined amount, and wherein the second power level exceeds the first power level by the predetermined amount.

In Example 5, the subject matter of Examples 1-4 includes, wherein the count increases are nonlinearly mapped to the power level increases.

In Example 6, the subject matter of Examples 1-5 includes, wherein activating the light source at the first power level to transmit the entire sequence requires less energy than a total energy required to activate the light source to transmit each bit of the sequence individually.

In Example 7, the subject matter of Examples 1-6 includes, wherein activating the light source at the first power level to transmit the entire sequence requires less time than a total time required to activate the light source to transmit each bit of the sequence individually.

Example 8 is a system for transmitting data over an optical communication path, the system comprising: a hardware processor; and a computer-readable storage device having computer-executable instructions stored thereon, which when executed by the hardware processor, configure the system to: receive a bitstream for transmission over the optical communication path; determine that the encoded bitstream includes, a sequence of consecutive bits with a same value; determine a first power level at which to transmit the sequence, wherein the first power level is determined based on a count of the consecutive bits in the sequence, and wherein count increases are mapped to power level increases; and selectively activate a light source at the first power level according to a first modulation scheme to optically transmit the entire sequence by transmitting a single bit of the sequence of consecutive bits using the first power level.

In Example 9, the subject matter of Example 8 includes, wherein each value of the sequence is associated with a corresponding power level; and wherein the first power level is based on a combination of corresponding power levels for each of the values of the sequence.

In Example 10, the subject matter of Examples 8-9 includes, wherein the instructions further configure the system to determine a second power level associated with a second sequence of consecutive bits with the same value, the second sequence having a higher count of consecutive bits than the sequence, and wherein the second power level is higher than the first power level.

In Example 11, the subject matter of Example 10 includes, wherein the instructions further configure the system to determine a third power level associated with a third sequence of consecutive bits with the same value, the third power level higher than the second power level, wherein the third power level is higher than the second power level by a predetermined amount, and wherein the second power level exceeds the first power level by the predetermined amount.

In Example 12, the subject matter of Examples 8-11 includes, wherein the count increases are nonlinearly mapped to the power level increases.

In Example 13, the subject matter of Examples 8-12 includes, wherein activating the light source at the first power level to transmit the entire sequence requires less energy than a total energy required to activate the light source to transmit each bit of the sequence individually.

In Example 14, the subject matter of Examples 8-13 includes, wherein activating the light source at the first power level to transmit the entire sequence requires less time than a total time required to activate the light source to transmit each bit of the sequence individually.

Example 15 is a system for transmitting data over an optical communication path, the system comprising: means for receiving a bitstream for transmission over the optical communication path; means for determining that the encoded bitstream includes, a sequence of consecutive bits with a same value; means for determining a first power level at which to transmit the sequence, wherein the first power level is determined based on a count of the consecutive bits in the sequence, and wherein count increases are mapped to power level increases; and means for selectively activating a light source at the first power level according to a first modulation scheme to optically transmit the entire sequence by transmitting a single bit of the sequence of consecutive bits using the first power level.

In Example 16, the subject matter of Example 15 includes, wherein each value of the sequence is associated with a corresponding power level; and wherein the first power level is based on a combination of corresponding power levels for each of the values of the sequence.

In Example 17, the subject matter of Examples 15-16 includes, means for determining a second power level associated with a second sequence of consecutive bits with the same value, the second sequence having a higher count of consecutive bits than the sequence, and wherein the second power level is higher than the first power level.

In Example 18, the subject matter of Example 17 includes, means for determining a third power level associated with a third sequence of consecutive bits with the same value, the third power level higher than the second power level, wherein the third power level is higher than the second power level by a predetermined amount, and wherein the second power level exceeds the first power level by the predetermined amount.

In Example 19, the subject matter of Example 18 includes, wherein the count increases are nonlinearly mapped to the power level increases.

In Example 20, the subject matter of Examples 15-19 includes, wherein activating the light source at the first power level to transmit the entire sequence requires less energy than a total energy required to activate the light source to transmit each bit of the sequence individually.

Example 21 is a method for receiving data over an optical communication path, the method comprising: receiving a transmission including one or more photons at a first power level at a first timeslot; identifying a first value of the one or more photons; determining a count of bits corresponding to the first value based on the first power level, wherein count increases are mapped to power level increases; creating a sequence of consecutive bits having the first value, the sequence comprising a number of bits corresponding to the count; and storing the sequence of consecutive bits as a bitstream in a memory.

In Example 22, the subject matter of Example 21 includes, wherein identifying the first value of the one or more photons includes applying a detection model.

In Example 23, the subject matter of Example 22 includes, wherein the detection model is a machine learning model trained using Poisson Regression of previous bitstreams and power levels.

In Example 24, the subject matter of Examples 22-23 includes, wherein the detection model is determined based on other received photons.

In Example 25, the subject matter of Examples 21-24 includes, wherein the count increases are nonlinearly mapped to the power level increases.

In Example 26, the subject matter of Examples 21-25 includes, wherein each bit of the sequence is associated with a corresponding power level, and wherein the first power level is based on a combination of the corresponding power levels for each of the bits of the sequence.

In Example 27, the subject matter of Examples 21-26 includes, determining a second sequence of consecutive bits received in the transmission associated with a second power level, the second sequence having a higher count of consecutive bits than the sequence, and wherein the second power level is higher than the first power level.

Example 28 is a system for receiving data over an optical communication path, the system comprising: a hardware processor; and a computer-readable storage device having computer-executable instructions stored thereon, which when executed by the hardware processor, configure the system to: receive a transmission including one or more photons at a first power level at a first timeslot; identify a first value of the one or more photons; determine a count of bits corresponding to the first value based on the first power level, wherein count increases are mapped to power level increases; create a sequence of consecutive bits having the first value, the sequence comprising a number of bits corresponding to the count; and store the sequence of consecutive bits as a bitstream in a memory.

In Example 29, the subject matter of Example 28 includes, wherein the instructions that configure the system to identify the first value of the one or more photons include instructions to apply a detection model.

In Example 30, the subject matter of Example 29 includes, wherein the detection model is a machine learning model trained using Poisson Regression of previous bitstreams and power levels.

In Example 31, the subject matter of Examples 29-30 includes, wherein the detection model is determined based on other received photons.

In Example 32, the subject matter of Examples 28-31 includes, wherein the count increases are nonlinearly mapped to the power level increases.

In Example 33, the subject matter of Examples 28-32 includes, wherein each bit of the sequence is associated with a corresponding power level, and wherein the first power level is based on a combination of the corresponding power levels for each of the bits of the sequence.

In Example 34, the subject matter of Examples 28-33 includes, wherein the instructions that configure the system to determine a second sequence of consecutive bits received in the transmission associated with a second power level, the second sequence having a higher count of consecutive bits than the sequence, and wherein the second power level is higher than the first power level.

Example 35 is a system for receiving data over an optical communication path, the system comprising: means for receiving a transmission including one or more photons at a first power level at a first timeslot; means for identifying a first value of the one or more photons; means for determining a count of bits corresponding to the first value based on the first power level, wherein count increases are mapped to power level increases; means for creating a sequence of consecutive bits having the first value, the sequence comprising a number of bits corresponding to the count; and means for storing the sequence of consecutive bits as a bitstream in a memory.

In Example 36, the subject matter of Example 35 includes, wherein the means for identifying the first value of the one or more photons include means for applying a detection model.

In Example 37, the subject matter of Example 36 includes, wherein the detection model is a machine learning model trained using Poisson Regression of previous bitstreams and power levels.

In Example 38, the subject matter of Examples 36-37 includes, wherein the detection model is determined based on other received photons.

In Example 39, the subject matter of Examples 35-38 includes, means for determining a second power level associated with a transmission of a second received set of one or more photons; means for comparing the second power level with the first power level; and means for wherein the bit count determination is performed in response to a determination that the first power level exceeds the second power level.

In Example 40, the subject matter of Examples 35-39 includes, wherein each bit of the sequence is associated with a corresponding power level, and wherein the first power level is based on a combination of the corresponding power levels for each of the bits of the sequence.

Example 41 is a method for transmitting data over an optical communication path, the method comprising: receiving a bitstream for transmission over the optical communication path; determining a sequence of sequential bits with a same first value in the bitstream, the sequence having a first size with a maximum number of bits while also having a corresponding first transmission power that does not exceed a threshold transmission power, the first transmission power determined by applying a mapping to the first size, the mapping comprising a plurality of sequence sizes and corresponding transmission powers, wherein the mapping increases transmission power as a number of bits increases; and selectively activating a light source at the first power level according to a modulation scheme to optically transmit the entire sequence by transmitting a single bit of the first value using the first transmission power.

In Example 42, the subject matter of Example 41 includes, determining a second sequence of sequential bits with the same first value in the bitstream, the second sequence having a second size with a maximum number of bits while also having a corresponding second transmission power that is less than a threshold transmission power, the transmission power determined by applying the mapping to the second size, the second transmission power less than the first transmission power and the second size less than the first size; and selectively activating the light source at the second power level according to the modulation scheme to optically transmit the entire second sequence by transmitting a single bit of the first same value using the second power level.

In Example 43, the subject matter of Examples 41-42 includes, wherein the threshold transmission power is a maximum power at which the light source is configured to transmit.

In Example 44, the subject matter of Examples 41-43 includes, wherein the mapping comprises an increase in power level that is non-linear with the increases in sequence size.

In Example 45, the subject matter of Examples 41-44 includes, wherein selectively activating the light source at the first power level according to the modulation scheme comprises modulating the single bit on a carrier wave using the first power level.

In Example 46, the subject matter of Examples 41-45 includes, wherein the modulation scheme is one of: a quadrature phase shift keying (QPSK), binary phase shift keying (BPSK), phase-shift keying (PSK), Quadrature amplitude modulation (QAM), or an amplitude and phase shift keying (APSK).

In Example 47, the subject matter of Examples 41-46 includes, wherein the optical communication path is a fiber optic and wherein selectively activating the light source at the first power level according to the modulation scheme comprises transmitting photons across the fiber optic.

In Example 48, the subject matter of Examples 41-47 includes, wherein activating the light source at the first power level according to the modulation scheme to optically transmit the entire sequence requires less time than a total time required to activate the light source to transmit each bit of the sequence individually.

Example 49 is a system for transmitting data over an optical communication path, the system comprising: a hardware processor; and a computer-readable storage device having computer-executable instructions stored thereon, which when executed by the hardware processor, configure the system to: receive a bitstream for transmission over the optical communication path; determine a sequence of sequential bits with a same first value in the bitstream, the sequence having a first size with a maximum number of bits while also having a corresponding first transmission power that does not exceed a threshold transmission power, the first transmission power determined by applying a mapping to the first size, the mapping comprising a plurality of sequence sizes and corresponding transmission powers, wherein the mapping increases transmission power as a number of bits increases; and selectively activate a light source at the first power level according to a modulation scheme to optically transmit the entire sequence by transmitting a single bit of the first value using the first transmission power.

In Example 50, the subject matter of Example 49 includes, wherein the system is further configured to: determine a second sequence of sequential bits with the same first value in the bitstream, the second sequence having a second size with a maximum number of bits while also having a corresponding second transmission power that is less than a threshold transmission power, the transmission power determined by applying the mapping to the second size, the second transmission power less than the first transmission power and the second size less than the first size; and selectively activate the light source at the second power level according to the modulation scheme to optically transmit the entire second sequence by transmitting a single bit of the first same value using the second power level.

In Example 51, the subject matter of Examples 49-50 includes, wherein the threshold transmission power is a maximum power at which the light source is configured to transmit.

In Example 52, the subject matter of Examples 49-51 includes, wherein the mapping comprises an increase in power level that is non-linear with the increases in sequence size.

In Example 53, the subject matter of Examples 49-52 includes, wherein selectively activating the light source at the first power level according to the modulation scheme comprises modulating the single bit on a carrier wave using the first power level.

In Example 54, the subject matter of Examples 49-53 includes, wherein the modulation scheme is one of: a quadrature phase shift keying (QPSK), binary phase shift keying (BPSK), phase-shift keying (PSK), Quadrature amplitude modulation (QAM), or an amplitude and phase shift keying (APSK).

In Example 55, the subject matter of Examples 49-54 includes, wherein the optical communication path is a fiber optic and wherein selectively activating the light source at the first power level according to the modulation scheme comprises transmitting photons across the fiber optic.

In Example 56, the subject matter of Examples 49-55 includes, wherein activating the light source at the first power level according to the modulation scheme to optically transmit the entire sequence requires less time than a total time required to activate the light source to transmit each bit of the sequence individually.

Example 57 is at least one non-transitory machine-readable medium including instructions for transmitting data over an optical communication path, which when executed by a hardware processor, cause the hardware processor to: receive a bitstream for transmission over the optical communication path; determine a sequence of sequential bits with a same first value in the bitstream, the sequence having a first size with a maximum number of bits while also having a corresponding first transmission power that does not exceed a threshold transmission power, the first transmission power determined by applying a mapping to the first size, the mapping comprising a plurality of sequence sizes and corresponding transmission powers, wherein the mapping increases transmission power as a number of bits increases; and selectively activate a light source at the first power level according to a modulation scheme to optically transmit the entire sequence by transmitting a single bit of the first value using the first transmission power.

In Example 58, the subject matter of Example 57 includes, wherein the instructions further configure the system to: determine a second sequence of sequential bits with the same first value in the bitstream, the second sequence having a second size with a maximum number of bits while also having a corresponding second transmission power that is less than a threshold transmission power, the transmission power determined by applying the mapping to the second size, the second transmission power less than the first transmission power and the second size less than the first size; and selectively activate the light source at the second power level according to the modulation scheme to optically transmit the entire second sequence by transmitting a single bit of the first same value using the second power level.

In Example 59, the subject matter of Examples 57-58 includes, wherein the threshold transmission power is a maximum power at which the light source is configured to transmit.

In Example 60, the subject matter of Examples 57-59 includes, wherein the mapping comprises an increase in power level that is non-linear with the increases in sequence size.

Example 61 is a method for receiving data over an optical communication path at a receiving device, the method comprising: determining a first value and a first power level transmitted by a transmitter over the optical communication path at a first timeslot based upon a first set of one or more received photons, the first power level is a threshold power level; determining the first value and a second power level transmitted by a transmitter over the optical communication path at a second timeslot following the first timeslot and based upon a second set of one or more received photons, the second power level not exceeding the threshold power level; creating a first bit sequence of repeating values of the first value comprising a number of repeating first values, a count of the number of first values determined based on a mapping of the first power level to the count, the mapping comprising a plurality of received power levels and corresponding counts of the number of repeating values, wherein the mapping increases the number of repeating values as the received power level increases; creating a second bit sequence of repeating values of the first value comprising a second number of repeating values based on the mapping and the second power level; combining the first and second bit sequences into a bitstream; and storing the bitstream in a memory.

In Example 62, the subject matter of Example 61 includes, wherein determining the first value and the first power level comprises applying one or more detection models to the first set of one or more received photons, the detection models Poisson regression models.

In Example 63, the subject matter of Example 62 includes, wherein at least one of the one or more detection models is configured to detect a value at a power level above the threshold power level.

In Example 64, the subject matter of Examples 61-63 includes, wherein the memory is a Random Access Memory (RAM).

In Example 65, the subject matter of Examples 61-64 includes, wherein the bit sequence is a binary bit sequence and the repeating values are a binary value of one.

In Example 66, the subject matter of Examples 61-65 includes, wherein the one or more received photons are received over the optical communication path, the optical communication path comprising a fiber optic.

In Example 67, the subject matter of Examples 61-66 includes, wherein the mapping comprises an increase in power level that is non-linear with the increases in sequence size.

Example 68 is a system for receiving data over an optical communication path at a receiving device, the system comprising: a hardware processor; and a computer-readable storage device having computer-executable instructions stored thereon, which when executed by the hardware processor, configure the system to: determine a first value and a first power level transmitted by a transmitter over the optical communication path at a first timeslot based upon a first set of one or more received photons, the first power level is a threshold power level; determine the first value and a second power level transmitted by a transmitter over the optical communication path at a second timeslot following the first timeslot and based upon a second set of one or more received photons, the second power level not exceeding the threshold power level; create a first bit sequence of repeating values of the first value comprising a number of repeating first values, a count of the number of first values determined based on a mapping of the first power level to the count, the mapping comprising a plurality of received power levels and corresponding counts of the number of repeating values, wherein the mapping increases the number of repeating values as the received power level increases; create a second bit sequence of repeating values of the first value comprising a second number of repeating values based on the mapping and the second power level; combine the first and second bit sequences into a bitstream; and store the bitstream in a memory.

In Example 69, the subject matter of Example 68 includes, wherein determining the first value and the first power level comprises applying one or more detection models to the first set of one or more received photons, the detection models Poisson regression models.

In Example 70, the subject matter of Example 69 includes, wherein at least one of the one or more detection models is configured to detect a value at a power level above the threshold power level.

In Example 71, the subject matter of Examples 68-70 includes, wherein the memory is a Random Access Memory (RAM).

In Example 72, the subject matter of Examples 68-71 includes, wherein the bit sequence is a binary bit sequence and the repeating values are a binary value of one.

In Example 73, the subject matter of Examples 68-72 includes, wherein the one or more received photons are received over the optical communication path, the optical communication path comprising a fiber optic.

In Example 74, the subject matter of Examples 68-73 includes, wherein the mapping comprises an increase in power level that is non-linear with the increases in sequence size.

Example 75 is at least one non-transitory machine-readable medium including instructions for receiving data over an optical communication path at a receiving device, which when executed by a hardware processor, cause the hardware processor to: determine a first value and a first power level transmitted by a transmitter over the optical communication path at a first timeslot based upon a first set of one or more received photons, the first power level is a threshold power level; determine the first value and a second power level transmitted by a transmitter over the optical communication path at a second timeslot following the first timeslot and based upon a second set of one or more received photons, the second power level not exceeding the threshold power level; create a first bit sequence of repeating values of the first value comprising a number of repeating first values, a count of the number of first values determined based on a mapping of the first power level to the count, the mapping comprising a plurality of received power levels and corresponding counts of the number of repeating values, wherein the mapping increases the number of repeating values as the received power level increases; create a second bit sequence of repeating values of the first value comprising a second number of repeating values based on the mapping and the second power level; combine the first and second bit sequences into a bitstream; and store the bitstream in a memory.

In Example 76, the subject matter of Example 75 includes, wherein determining the first value and the first power level comprises applying one or more detection models to the first set of one or more received photons, the detection models Poisson regression models.

In Example 77, the subject matter of Example 76 includes, wherein at least one of the one or more detection models is configured to detect a value at a power level above the threshold power level.

In Example 78, the subject matter of Examples 75-77 includes, wherein the memory is a Random Access Memory (RAM).

In Example 79, the subject matter of Examples 75-78 includes, wherein the bit sequence is a binary bit sequence and the repeating values are a binary value of one.

In Example 80, the subject matter of Examples 75-79 includes, wherein the one or more received photons are received over the optical communication path, the optical communication path comprising a fiber optic.

Example 81 is a method for transmitting data over an optical communication path, the method comprising: receiving a bitstream for transmission over the optical communication path; determining a first sequence of bits in the bitstream that comprise a plurality of consecutive same first values; packetizing the sequence of bits into a plurality of transmission packets by maximizing a number of bits assignable to each packet while still having a corresponding transmission power for each packet that is not greater than a threshold transmission power, the transmission power of each particular packet determined by applying a mapping of a number of bits in each packet, the mapping comprising a plurality of packet sizes and corresponding power levels, wherein the mapping increases transmission power as the number of bits increase; determining that a first packet of one of the plurality of transmission packets is transmitting at a first power level corresponding to the threshold transmission power and that a second packet of one of the plurality of transmission packets is transmitting at a second power level that is less than the threshold level; moving a bit from the first packet to the second packet such that the power level of the first packet, as determined by the mapping, is lowered and the second power level of the second packet, as determined by the mapping, is raised such that both the first and second power levels are below the threshold transmission power; selectively activating a light source at the first power level according to the modulation scheme to optically transmit the entire first packet by transmitting a single bit of the same first value at the lowered first power level; and selectively activating the light source at the raised second power level according to the modulation scheme to optically transmit the entire second packet by transmitting a single bit of the same first value at the second power level.

In Example 82, the subject matter of Example 81 includes, wherein the threshold power is a maximum power configured for transmission.

In Example 83, the subject matter of Examples 81-82 includes, wherein the threshold power level is less than a maximum power configured for transmission.

In Example 84, the subject matter of Examples 81-83 includes, wherein the method comprises determining the threshold power based upon historical past power levels at which the light source was activated.

In Example 85, the subject matter of Examples 81-84 includes, wherein the mapping maps a first number of bits to a first power level, a second number of bits greater than the first number of bits to a second power level greater than the first power level and a third number of bits greater than the second number of bits to a third power level greater than the second power level.

In Example 86, the subject matter of Examples 81-85 includes, wherein the modulation scheme is one of: a quadrature phase shift keying (QPSK), binary phase shift keying (BPSK), phase-shift keying (PSK), Quadrature amplitude modulation (QAM), or an amplitude and phase shift keying (APSK).

In Example 87, the subject matter of Examples 81-86 includes, wherein the optical communication path is a fiber optic and wherein selectively activating the light source at the first power level according to the modulation scheme comprises transmitting photons across the fiber optic.

In Example 88, the subject matter of Examples 81-87 includes, wherein activating the light source at the first power level to transmit the entire first packet requires less time than a total time required to activate the light source to transmit each bit of the first packet individually.

Example 89 is a system for transmitting data over an optical communication path, the system comprising: a hardware processor; and a computer-readable storage device having computer-executable instructions stored thereon, which when executed by the hardware processor, configure the system to: receive a bitstream for transmission over the optical communication path; determine a first sequence of bits in the bitstream that comprise a plurality of consecutive same first values; packetize the sequence of bits into a plurality of transmission packets by maximizing a number of bits assignable to each packet while still having a corresponding transmission power for each packet that is not greater than a threshold transmission power, the transmission power of each particular packet determined by applying a mapping of a number of bits in each packet, the mapping comprising a plurality of packet sizes and corresponding power levels, wherein the mapping increases transmission power as the number of bits increase; determine that a first packet of one of the plurality of transmission packets is transmitting at a first power level corresponding to the threshold transmission power and that a second packet of one of the plurality of transmission packets is transmitting at a second power level that is less than the threshold level; move a bit from the first packet to the second packet such that the power level of the first packet, as determined by the mapping, is lowered and the second power level of the second packet, as determined by the mapping, is raised such that both the first and second power levels are below the threshold transmission power; selectively activate a light source at the first power level according to the modulation scheme to optically transmit the entire first packet by transmitting a single bit of the same first value at the lowered first power level; and selectively activate the light source at the raised second power level according to the modulation scheme to optically transmit the entire second packet by transmitting a single bit of the same first value at the second power level.

In Example 90, the subject matter of Example 89 includes, wherein the threshold power is a maximum power configured for transmission.

In Example 91, the subject matter of Examples 89-90 includes, wherein the threshold power level is less than a maximum power configured for transmission.

In Example 92, the subject matter of Examples 89-91 includes, wherein the method comprises determining the threshold power based upon historical past power levels at which the light source was activated.

In Example 93, the subject matter of Examples 89-92 includes, wherein the mapping maps a first number of bits to a first power level, a second number of bits greater than the first number of bits to a second power level greater than the first power level and a third number of bits greater than the second number of bits to a third power level greater than the second power level.

In Example 94, the subject matter of Examples 89-93 includes, wherein the modulation scheme is one of: a quadrature phase shift keying (QPSK), binary phase shift keying (BPSK), phase-shift keying (PSK), Quadrature amplitude modulation (QAM), or an amplitude and phase shift keying (APSK).

In Example 95, the subject matter of Examples 89-94 includes, wherein the optical communication path is a fiber optic and wherein selectively activating the light source at the first power level according to the modulation scheme comprises transmitting photons across the fiber optic.

In Example 96, the subject matter of Examples 89-95 includes, wherein activating the light source at the first power level to transmit the entire first packet requires less time than a total time required to activate the light source to transmit each bit of the first packet individually.

Example 97 is at least one non-transitory machine-readable medium including instructions for transmitting data over an optical communication path, which when executed by a hardware processor, cause the hardware processor to: receive a bitstream for transmission over the optical communication path; determine a first sequence of bits in the bitstream that comprise a plurality of consecutive same first values; packetize the sequence of bits into a plurality of transmission packets by maximizing a number of bits assignable to each packet while still having a corresponding transmission power for each packet that is not greater than a threshold transmission power, the transmission power of each particular packet determined by applying a mapping of a number of bits in each packet, the mapping comprising a plurality of packet sizes and corresponding power levels, wherein the mapping increases transmission power as the number of bits increase; determine that a first packet of one of the plurality of transmission packets is transmitting at a first power level corresponding to the threshold transmission power and that a second packet of one of the plurality of transmission packets is transmitting at a second power level that is less than the threshold level; move a bit from the first packet to the second packet such that the power level of the first packet, as determined by the mapping, is lowered and the second power level of the second packet, as determined by the mapping, is raised such that both the first and second power levels are below the threshold transmission power; selectively activate a light source at the first power level according to the modulation scheme to optically transmit the entire first packet by transmitting a single bit of the same first value at the lowered first power level; and selectively activate the light source at the raised second power level according to the modulation scheme to optically transmit the entire second packet by transmitting a single bit of the same first value at the second power level.

In Example 98, the subject matter of Example 97 includes, wherein the threshold power is a maximum power configured for transmission.

In Example 99, the subject matter of Examples 97-98 includes, wherein the threshold power level is less than a maximum power configured for transmission.

In Example 100, the subject matter of Examples 97-99 includes, wherein the method comprises determining the threshold power based upon historical past power levels at which the light source was activated.

Example 101 is a method for receiving data over an optical communication path at a receiving device, the method comprising: determining a first value and a first power level transmitted by a transmitter over the optical communication path at a first timeslot based upon a first set of one or more received photons, the first power level less than a threshold power level; determining the first value and a second power level transmitted by a transmitter over the optical communication path at a second timeslot following the first timeslot based upon a second set of one or more received photons, the second power level less than the threshold power level; creating a first bit sequence of repeating values of the first value comprising a number of repeating first values, a count of the number of first values determined based on a mapping of the first power level to the count, the mapping comprising a plurality of received power levels and corresponding counts of the number of repeating values, wherein the mapping increases the number of repeating values as the received power level increases; creating a second bit sequence of repeating values of the first value comprising a second count of the number of repeating values based on the mapping and the second power level; combining the first and second bit sequences into a bitstream; and storing the bitstream in a memory.

In Example 102, the subject matter of Example 101 includes, wherein determining the first value and the first power level comprises applying one or more detection models to the first set of one or more received photons, the detection models Poisson regression models.

In Example 103, the subject matter of Example 102 includes, wherein one of the one or more detection models is configured to determine a value at a power level above the threshold power level.

In Example 104, the subject matter of Examples 101-103 includes, wherein the memory is a Random Access Memory (RAM).

In Example 105, the subject matter of Examples 101-104 includes, wherein the bit sequence is a binary bit sequence and the repeating values are a binary value of one.

In Example 106, the subject matter of Examples 101-105 includes, wherein the one or more received photons are received over the optical communication path, the optical communication path comprising a fiber optic.

In Example 107, the subject matter of Examples 101-106 includes, wherein the first and second power levels are a same power level.

Example 108 is a system for receiving data over an optical communication path at a receiving device, the system comprising: a hardware processor; and a computer-readable storage device having computer-executable instructions stored thereon, which when executed by the hardware processor, configure the system to: determine a first value and a first power level transmitted by a transmitter over the optical communication path at a first timeslot based upon a first set of one or more received photons, the first power level less than a threshold power level; determine the first value and a second power level transmitted by a transmitter over the optical communication path at a second timeslot following the first timeslot based upon a second set of one or more received photons, the second power level less than the threshold power level; create a first bit sequence of repeating values of the first value comprising a number of repeating first values, a count of the number of first values determined based on a mapping of the first power level to the count, the mapping comprising a plurality of received power levels and corresponding counts of the number of repeating values, wherein the mapping increases the number of repeating values as the received power level increases; create a second bit sequence of repeating values of the first value comprising a second count of the number of repeating values based on the mapping and the second power level; combine the first and second bit sequences into a bitstream; and store the bitstream in a memory.

In Example 109, the subject matter of Example 108 includes, wherein determining the first value and the first power level comprises applying one or more detection models to the first set of one or more received photons, the detection models Poisson regression models.

In Example 110, the subject matter of Example 109 includes, wherein one of the one or more detection models is configured to determine a value at a power level above the threshold power level.

In Example 111, the subject matter of Examples 108-110 includes, wherein the memory is a Random Access Memory (RAM).

In Example 112, the subject matter of Examples 108-111 includes, wherein the bit sequence is a binary bit sequence and the repeating values are a binary value of one.

In Example 113, the subject matter of Examples 108-112 includes, wherein the one or more received photons are received over the optical communication path, the optical communication path comprising a fiber optic.

In Example 114, the subject matter of Examples 108-113 includes, wherein the first and second power levels are a same power level.

Example 115 is at least one non-transitory machine-readable medium including instructions for receiving data over an optical communication path at a receiving device, which when executed by a hardware processor cause the hardware processor to: determine a first value and a first power level transmitted by a transmitter over the optical communication path at a first timeslot based upon a first set of one or more received photons, the first power level less than a threshold power level; determine the first value and a second power level transmitted by a transmitter over the optical communication path at a second timeslot following the first timeslot based upon a second set of one or more received photons, the second power level less than the threshold power level; create a first bit sequence of repeating values of the first value comprising a number of repeating first values, a count of the number of first values determined based on a mapping of the first power level to the count, the mapping comprising a plurality of received power levels and corresponding counts of the number of repeating values, wherein the mapping increases the number of repeating values as the received power level increases; create a second bit sequence of repeating values of the first value comprising a second count of the number of repeating values based on the mapping and the second power level; combine the first and second bit sequences into a bitstream; and store the bitstream in a memory.

In Example 116, the subject matter of Example 115 includes, wherein determining the first value and the first power level comprises applying one or more detection models to the first set of one or more received photons, the detection models Poisson regression models.

In Example 117, the subject matter of Example 116 includes, wherein one of the one or more detection models is configured to determine a value at a power level above the threshold power level.

In Example 118, the subject matter of Examples 115-117 includes, wherein the memory is a Random Access Memory (RAM).

In Example 119, the subject matter of Examples 115-118 includes, wherein the bit sequence is a binary bit sequence and the repeating values are a binary value of one.

In Example 120, the subject matter of Examples 115-119 includes, wherein the one or more received photons are received over the optical communication path, the optical communication path comprising a fiber optic.

Example 121 is at least one machine-readable medium including instructions that, when executed by processing circuitry, cause the processing circuitry to perform operations to implement of any of Examples 1-120.

Example 122 is an apparatus comprising means to implement of any of Examples 1-120.

Example 123 is a system to implement of any of Examples 1-120.

Example 124 is a method to implement of any of Examples 1-120.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

We claim:

1. A method for receiving data over an optical communication path at a receiving device, the method comprising:
determining a first power level transmitted by a transmitter over the optical communication path at a first timeslot based upon a first received photon having a value, the first power level less than a threshold power level;
determining a second power level transmitted by a transmitter over the optical communication path at a second timeslot following the first timeslot based upon a second received photon having the value, the second power level less than the threshold power level;
creating a first bit sequence of repeating values of the value from the first received photon, a count of the first bit sequence of repeating values determined based on a mapping of the first power level to the count, wherein the count is proportional to the first power level;
creating a second bit sequence of repeating values of the value from the second received photon, the second bit sequence comprising a second count of the second bit sequence of repeating values based on the mapping and the second count being proportional to the second power level;
combining the first and second bit sequences into a bitstream; and
storing the bitstream in a memory.

2. The method of claim 1, wherein determining the first power level comprises applying a detection model to the first received photon, and wherein the detection model includes a Poisson regression model.

3. The method of claim 2, wherein the detection model is configured to determine a value at a power level above the threshold power level.

4. The method of claim 1, wherein the memory is a Random Access Memory (RAM).

5. The method of claim 1, wherein the first bit sequence is a binary bit sequence and the repeating values are a binary value of one.

6. The method of claim 1, wherein the received photon is received over the optical communication path, the optical communication path comprising a fiber optic.

7. The method of claim 1, wherein the first and second power levels are a same power level.

8. A system for receiving data over an optical communication path at a receiving device, the system comprising:
a hardware processor; and
a computer-readable storage device having computer-executable instructions stored thereon, which when executed by the hardware processor, configure the system to:
determine a first power level transmitted by a transmitter over the optical communication path at a first timeslot based upon a first received photon having a value, the first power level less than a threshold power level;
determine a second power level transmitted by a transmitter over the optical communication path at a second timeslot following the first timeslot based upon a second received photon having the value, the second power level less than the threshold power level;

create a first bit sequence of repeating values of the value from the first received photon, a count of the first bit sequence of repeating values determined based on a mapping of the first power level to the count, wherein the count is proportional to the first power level;

create a second bit sequence of repeating values of the value from the second received photon, the second bit sequence comprising a second count of the second bit sequence of repeating values based on the mapping and the second count being proportional to the second power level;

combine the first and second bit sequences into a bitstream; and store the bitstream in a memory.

9. The system of claim 8, wherein determining the first power level comprises applying a detection model to the first received photon, and wherein the detection model includes a Poisson regression model.

10. The system of claim 9, wherein the detection model is configured to determine a value at a power level above the threshold power level.

11. The system of claim 8, wherein the memory is a Random Access Memory (RAM).

12. The system of claim 8, wherein the first bit sequence is a binary bit sequence and the repeating values are a binary value of one.

13. The system of claim 8, wherein the received photon is received over the optical communication path, the optical communication path comprising a fiber optic.

14. The system of claim 8, wherein the first and second power levels are a same power level.

15. At least one non-transitory machine-readable medium including instructions for receiving data over an optical communication path at a receiving device, which when executed by a hardware processor cause the hardware processor to:

determine a first power level transmitted by a transmitter over the optical communication path at a first timeslot based upon a first received photon having a value, the first power level less than a threshold power level;

determine a second power level transmitted by a transmitter over the optical communication path at a second timeslot following the first timeslot based upon a second received photon having the value, the second power level less than the threshold power level;

create a first bit sequence of repeating values of the value from the first received photon, a count of the first bit sequence of repeating values determined based on a mapping of the first power level to the count, wherein the count is proportional to the first power level;

create a second bit sequence of repeating values of the value from the second received photon, the second bit sequence comprising a second count of the second bit sequence of repeating values based on the mapping and the second count being proportional to the second power level;

combine the first and second bit sequences into a bitstream; and store the bitstream in a memory.

16. The at least one machine-readable medium of claim 15, wherein determining the first power level comprises applying a detection model to the first received photon, and wherein the detection model includes a Poisson regression model.

17. The at least one machine-readable medium of claim 16, wherein the detection model is configured to determine a value at a power level above the threshold power level.

18. The at least one machine-readable medium of claim 15, wherein the memory is a Random Access Memory (RAM).

19. The at least one machine-readable medium of claim 15, wherein the first bit sequence is a binary bit sequence and the repeating values are a binary value of one.

20. The at least one machine-readable medium of claim 15, wherein the received photon is received over the optical communication path, the optical communication path comprising a fiber optic.

* * * * *